(12) United States Patent
Yasuda et al.

(10) Patent No.: US 9,748,231 B2
(45) Date of Patent: Aug. 29, 2017

(54) SEMICONDUCTOR DEVICE

(71) Applicant: FUJITSU SEMICONDUCTOR LIMITED, Yokohama-shi, Kanagawa (JP)

(72) Inventors: Makoto Yasuda, Kuwana (JP); Taiji Ema, Inabe (JP); Mitsuaki Hori, Kuwana (JP); Kazushi Fujita, Kuwana (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/313,529

(22) Filed: Jun. 24, 2014

(65) Prior Publication Data
US 2015/0008526 A1  Jan. 8, 2015

(30) Foreign Application Priority Data

Jul. 8, 2013  (JP) .................. 2013-142535

(51) Int. Cl.
*H01L 27/088* (2006.01)
*H01L 27/092* (2006.01)
(Continued)

(52) U.S. Cl.
CPC .... *H01L 27/088* (2013.01); *H01L 21/823892* (2013.01); *H01L 27/0207* (2013.01);
(Continued)

(58) Field of Classification Search
CPC ..... H01L 27/11; H01L 27/092; H01L 27/088; H01L 21/823892; H01L 21/8239;
(Continued)

(56) References Cited

U.S. PATENT DOCUMENTS 8,035,169 B2 * 10/2011 Ishida ............... H01L 21/26506
                                                          257/240
2006/0048702 A1 * 3/2006 Son et al. ...................... 117/94
(Continued)

FOREIGN PATENT DOCUMENTS

JP           3-90327 U      9/1991
JP       2002-237532 A      8/2002
(Continued)

OTHER PUBLICATIONS

Office Action dated Jul. 29, 2015, issued in counterpart Korean Patent Application No. 10-2014-0078816, with English translation (8 pages).

(Continued)

*Primary Examiner* — Daniel Luke
*Assistant Examiner* — Khatib Rahman
(74) *Attorney, Agent, or Firm* — Westerman, Hattori, Daniels & Adrian, LLP

(57) ABSTRACT

A semiconductor device includes: a substrate; a first active region formed in the substrate and that includes a first region that has a first width and a second region including a second width larger than the first width and extended in a first direction; a second active region formed in the substrate and extended in parallel to the second region of the first active region; and an element isolation insulating film formed in the substrate and that partitions the first active region and the second active region, respectively, wherein the second region of the first active region or the second active region includes a depressed part depressed in a second direction that is perpendicular to the first direction in a plan view.

13 Claims, 21 Drawing Sheets

(51) Int. Cl.
*H01L 21/8238* (2006.01)
*H01L 27/02* (2006.01)
*H01L 27/11* (2006.01)
*H01L 29/10* (2006.01)
*H01L 21/265* (2006.01)
*H01L 21/28* (2006.01)
*H01L 29/66* (2006.01)
*H01L 29/78* (2006.01)

(52) U.S. Cl.
CPC ........ *H01L 27/092* (2013.01); *H01L 27/1104* (2013.01); *H01L 29/1083* (2013.01); *H01L 29/6659* (2013.01); *H01L 21/26506* (2013.01); *H01L 21/26513* (2013.01); *H01L 21/28202* (2013.01); *H01L 29/665* (2013.01); *H01L 29/7833* (2013.01)

(58) Field of Classification Search
CPC ............. H01L 27/0207; H01L 27/1104; H01L 29/1083; H01L 29/6659; H01L 29/04; H01L 21/336
USPC ........ 257/213, 288, 368, 255, 402, E21.409, 257/E29.242, E29.004; 438/291, 198
See application file for complete search history.

(56) References Cited

U.S. PATENT DOCUMENTS

| | | | |
|---|---|---|---|
| 2007/0246769 A1 | 10/2007 | Nakamura | |
| 2009/0134467 A1 | 5/2009 | Ishida et al. | |
| 2009/0189198 A1* | 7/2009 | Miyashita | 257/255 |
| 2011/0073958 A1* | 3/2011 | Chang | H01L 27/0207 257/390 |
| 2011/0278677 A1* | 11/2011 | Otsuki | H01L 27/1104 257/369 |
| 2012/0080759 A1 | 4/2012 | Ema et al. | |
| 2012/0228714 A1* | 9/2012 | Lim et al. | 257/369 |
| 2013/0026580 A1* | 1/2013 | Morimoto et al. | 257/369 |
| 2015/0009750 A1* | 1/2015 | Schaefer | G11C 11/412 365/156 |

FOREIGN PATENT DOCUMENTS

| | | |
|---|---|---|
| JP | 2007-294629 A | 11/2007 |
| JP | 2009-130167 A | 6/2009 |
| JP | 2009-176407 A | 8/2009 |
| JP | 2009-252825 A | 10/2009 |
| JP | 2012-79746 A | 4/2012 |
| KR | 10-2009-0056255 A | 6/2009 |

OTHER PUBLICATIONS

Office Action dated Feb. 18, 2016, issued in counterpart Korean Patent Application No. 10-2014-0078816, with English translation. (9 pages).
Office Action dated Aug. 2, 2016, issued in counterpart Chinese Patent Application No. 201410307590.2, with English translation. (16 pages).
Office Action dated Jan. 21, 2017, issued in counterpart Korean Application No. 10-2016-0175626, with English translation (11 pages).
Office Action dated Mar. 21, 2017, issued in counterpart Japanese Application No. 2013-142535, with English translation (11 pages).
Office Action dated Apr. 12, 2017, issued in counterpart Chinese Application No. 201410307590.2, with English translation (19 pages).

* cited by examiner

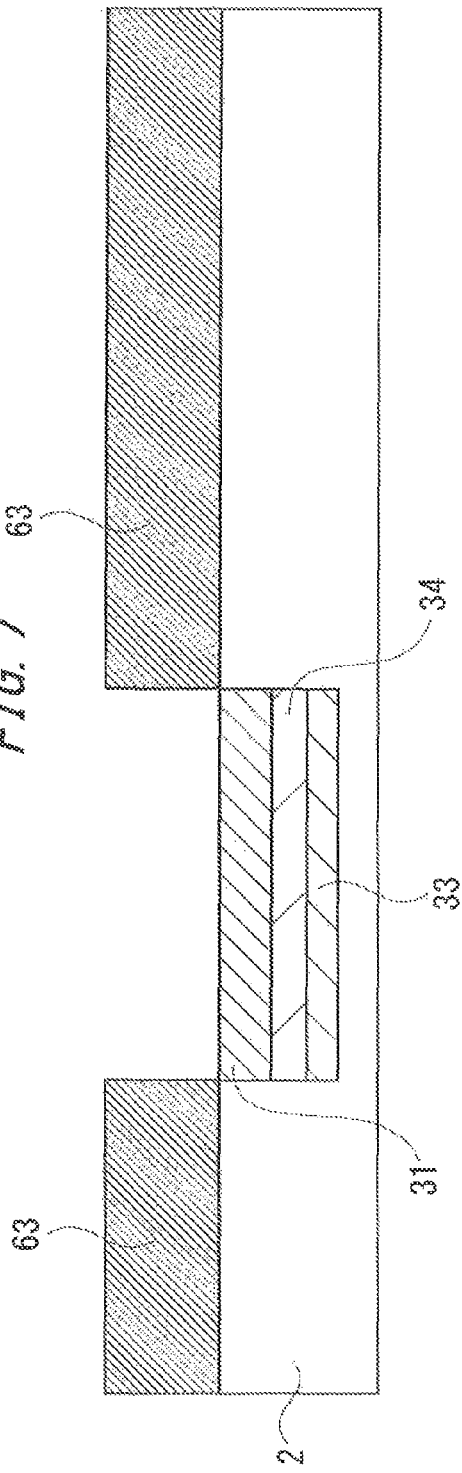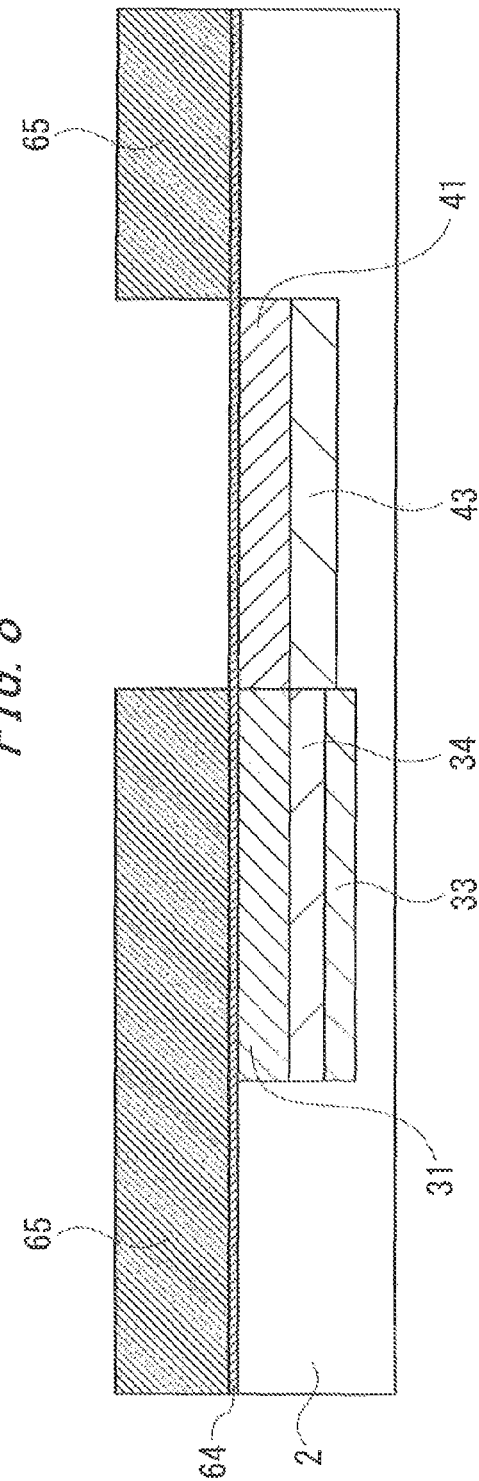

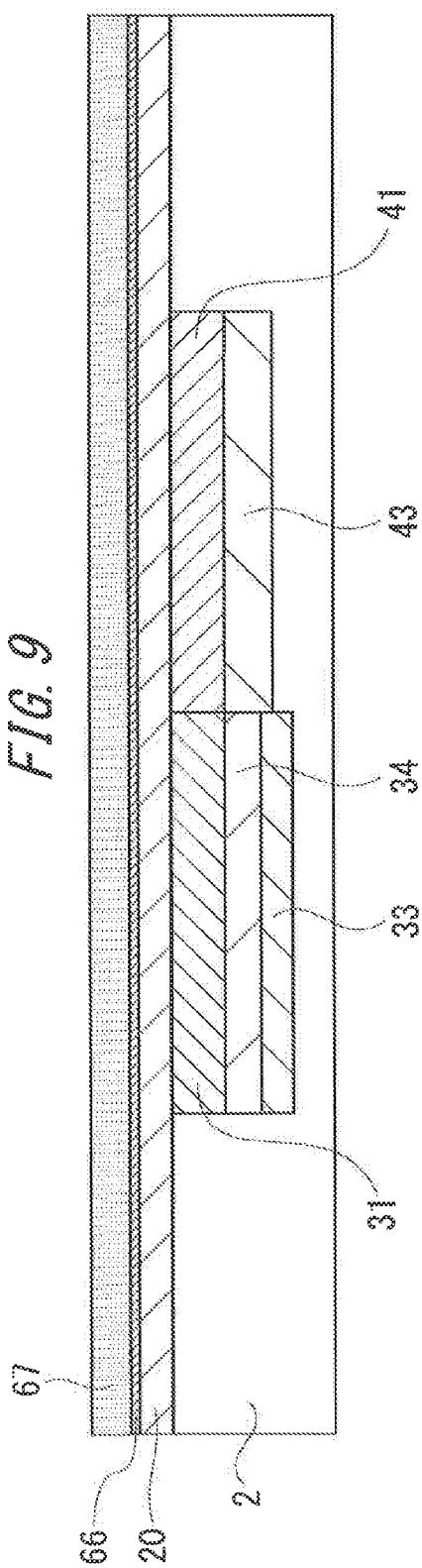
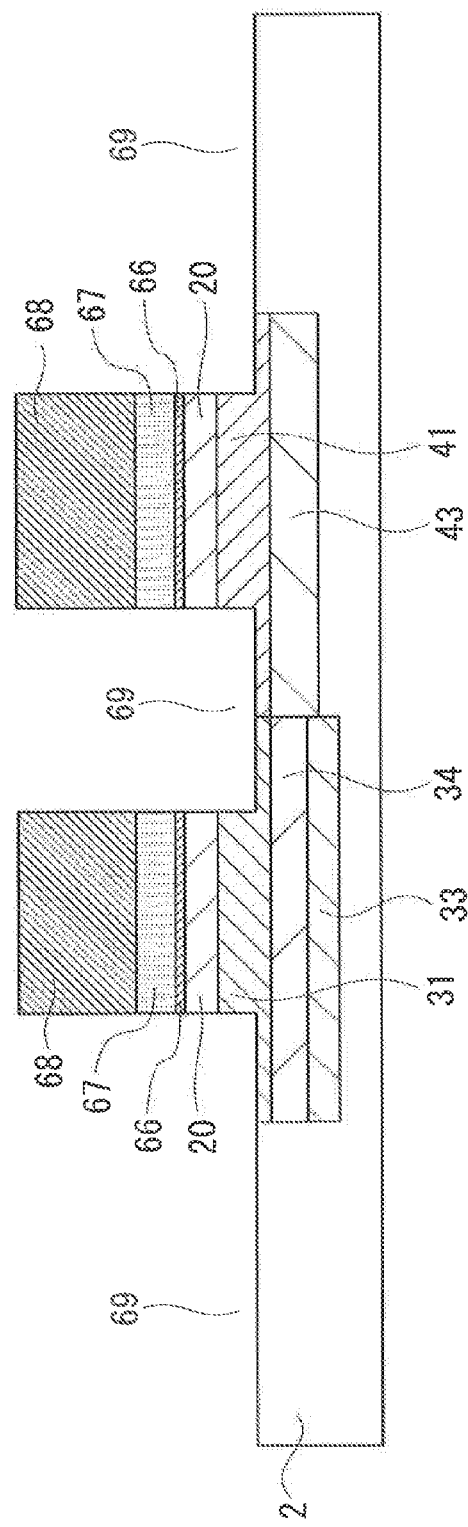
FIG. 9
FIG. 10

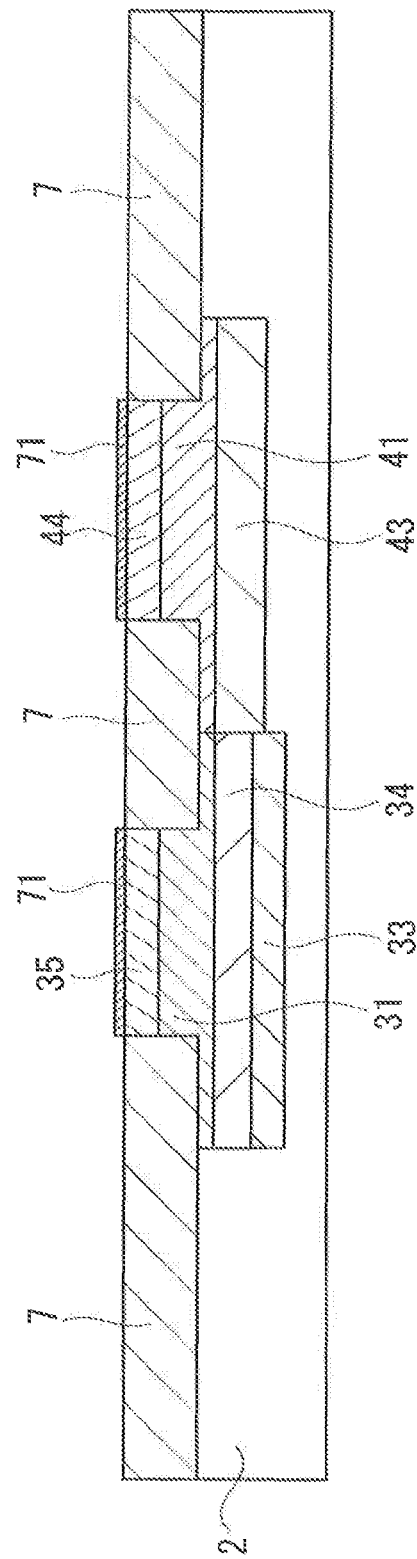
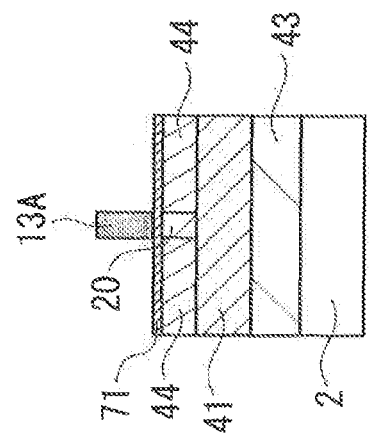
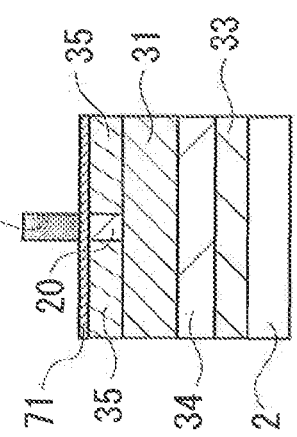

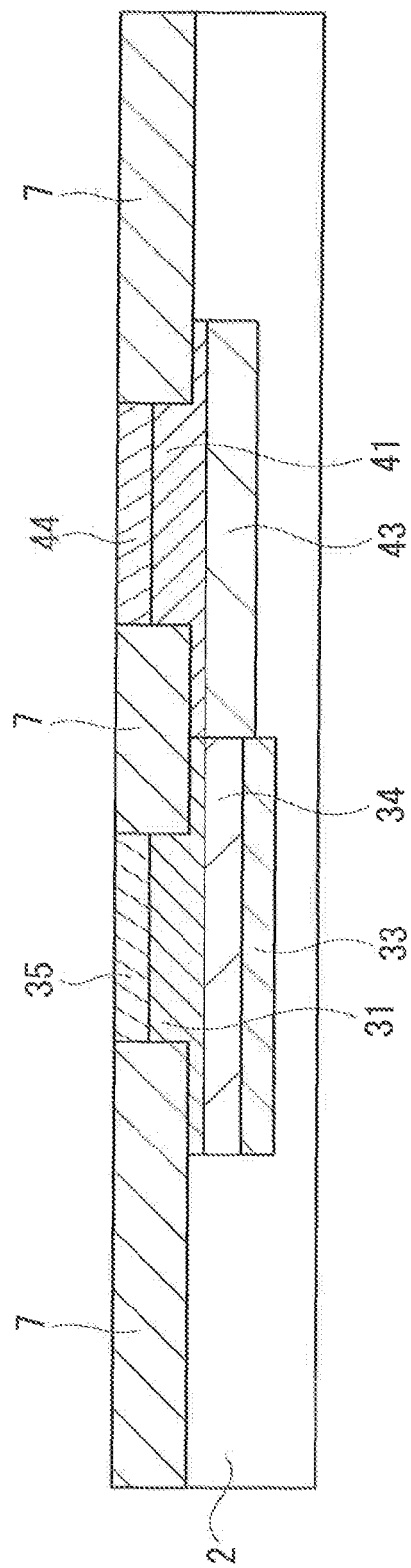

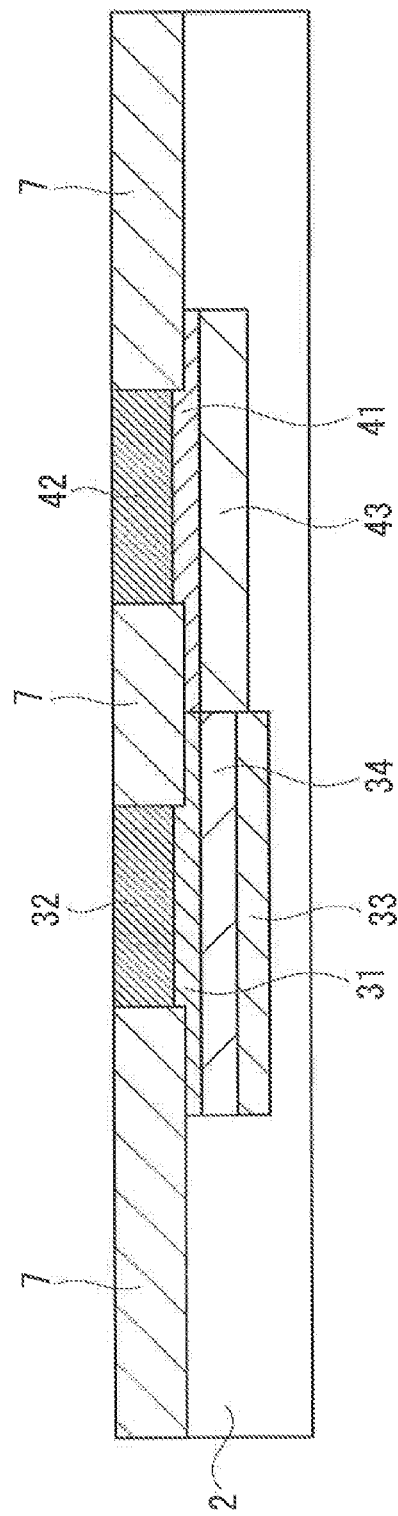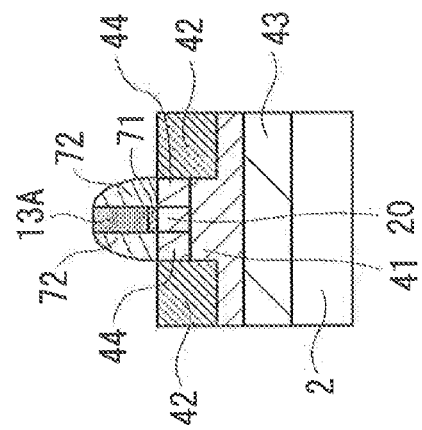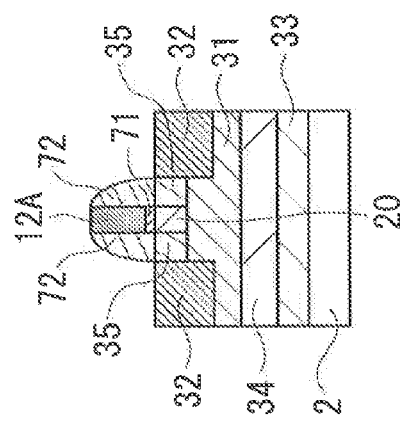

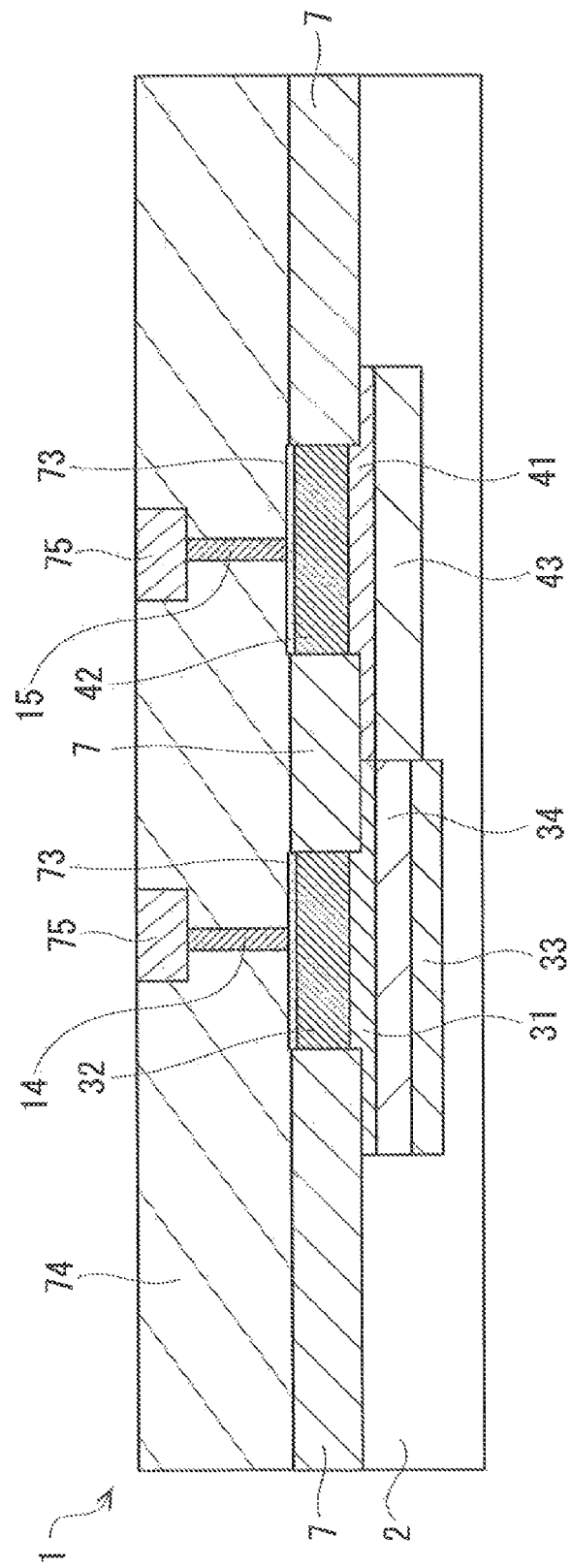

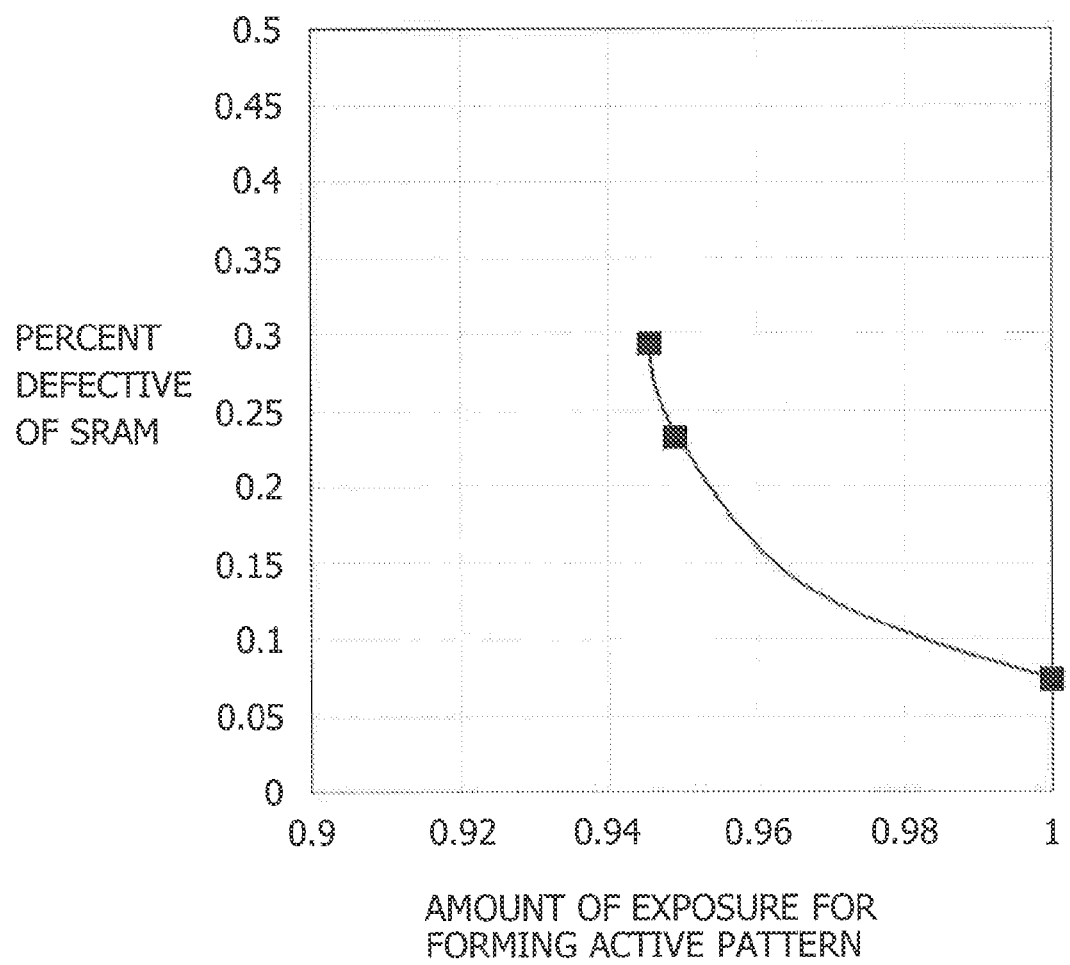

SEMICONDUCTOR DEVICE

CROSS-REFERENCE TO RELATED APPLICATIONS

This application is based upon and claims the benefit of prior Japanese Patent Application No. 2013-142535 filed on Jul. 8, 2013, the entire contents of which are incorporated herein by reference.

FIELD

The embodiment relates to a semiconductor device.

BACKGROUND

With the miniaturization of a semiconductor integrated circuit, there has been demanded the miniaturization of an active region, an element isolation insulating film, and a gate electrode, which are formed in a semiconductor substrate. The element isolation insulating film is formed by embedding an oxide film in a groove formed in the semiconductor substrate. The element isolation insulating film is formed in the semiconductor substrate, whereby the active regions are partitioned.

[Patent document 1] Japanese Laid-open Patent Publication No. 2009-252825

[Patent document 2] Japanese Laid-open Patent Publication No. 2009-176407

SUMMARY

According to an aspect of the embodiment, a semiconductor device includes: a substrate; a first active region formed in the substrate and that includes a first region including a first width and a second region that has a second width larger than the first width and extended in a first direction; a second active region formed in the substrate and extended in parallel to the second region of the first active region; and an element isolation insulating film formed in the substrate and that partitions the first active region and the second active region, respectively, wherein the second region of the first active region or the second active region includes a depressed part depressed in a second direction that is perpendicular to the first direction in a plan view.

The object and advantages of the embodiments will be realized and attained by means of the elements and combinations particularly pointed out in the claims.

It is to be understood that both the foregoing general description and the following detailed description are exemplary and explanatory and are not restrictive of the embodiments, as claimed.

BRIEF DESCRIPTION OF THE DRAWINGS

FIG. 7 is a section view to illustrate the method for manufacturing a semiconductor device 1 according to the embodiment.

FIG. 8 is a section view to illustrate the method for manufacturing a semiconductor device 1 according to the embodiment.

FIG. 9 is a section view to illustrate the method for manufacturing a semiconductor device 1 according to the embodiment.

FIG. 10 is a section view to illustrate the method for manufacturing a semiconductor device 1 according to the embodiment.

FIG. 14A is a section view to illustrate the method for manufacturing a semiconductor device 1 according to the embodiment.

FIG. 14B is a section view to illustrate the method for manufacturing a semiconductor device 1 according to the embodiment.

FIG. 14C is a section view to illustrate the method for manufacturing a semiconductor device 1 according to the embodiment.

FIG. 15A is a section view to illustrate the method for manufacturing a semiconductor device 1 according to the embodiment.

FIG. 15B is a section view to illustrate the method for manufacturing a semiconductor device 1 according to the embodiment.

FIG. 15C is a section view to illustrate the method for manufacturing a semiconductor device 1 according to the embodiment.

FIG. 16A is a section view to illustrate the method for manufacturing a semiconductor device 1 according to the embodiment.

FIG. 16B is a section view to illustrate the method for manufacturing a semiconductor device 1 according to the embodiment.

FIG. 16C is a section view to illustrate the method for manufacturing a semiconductor device 1 according to the embodiment.

FIG. 17A is a section view to illustrate the method for manufacturing a semiconductor device 1 according to the embodiment.

FIG. 24 is a graph to illustrate a relationship between an amount of exposure at the time of patterning an active region and a percent defective of an SRAM.

DESCRIPTION OF EMBODIMENTS

Figure 22:
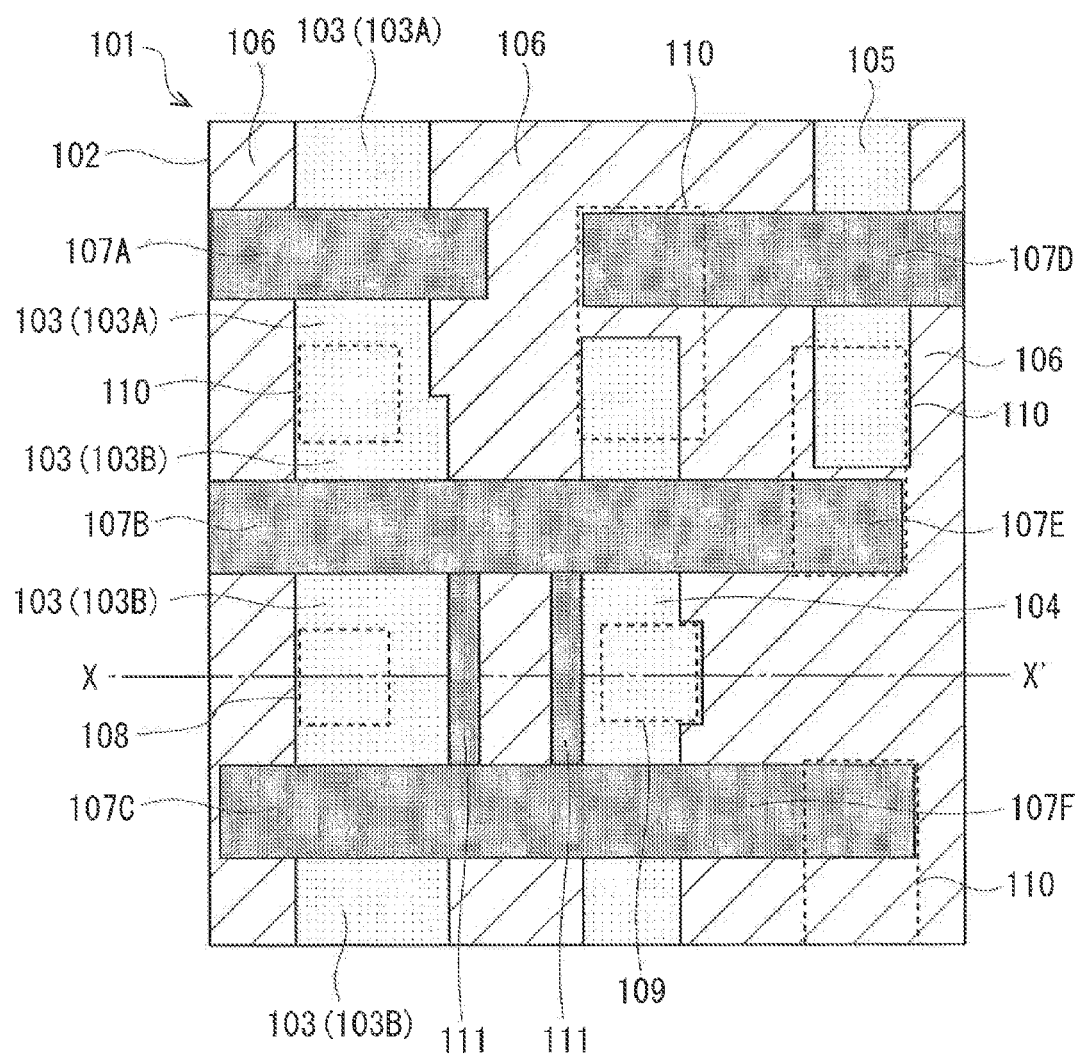
FIG. 22 is a partial plan view of an SRAM 101.
Figure 23:
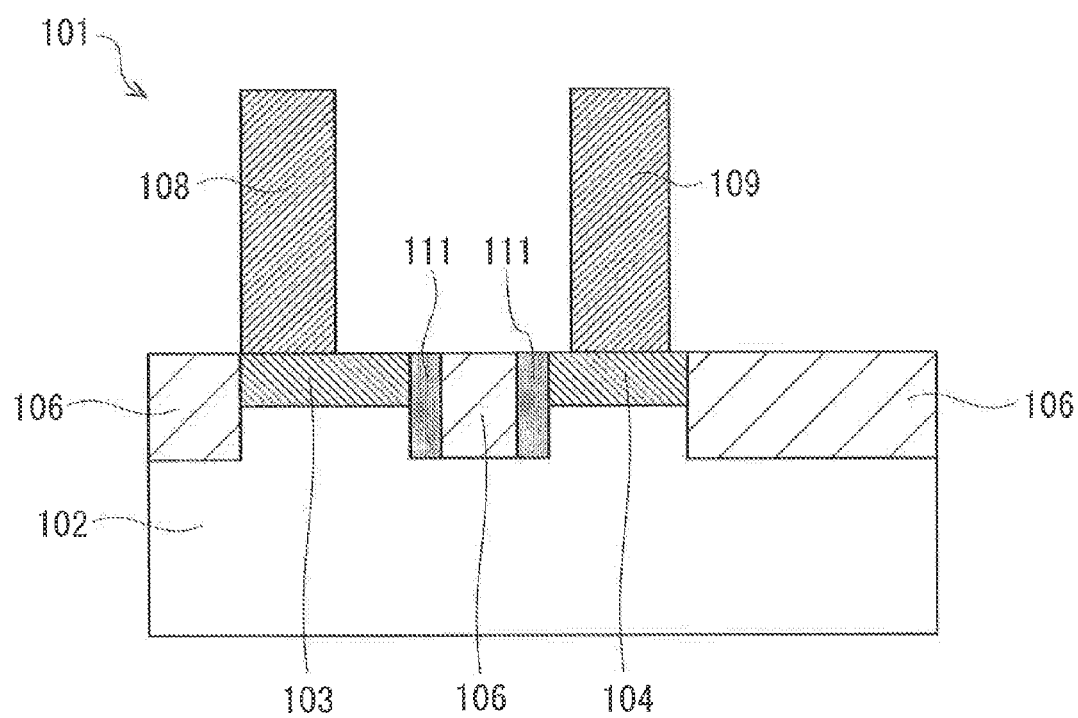
FIG. 23 is a section view of the SRAM 101 and illustrates a section taken on a single dot and dash line X-X' of FIG. 22.

A problem found as the result of study by the present inventors will be described. FIG. 22 is a partial plan view of an SRAM (Static Random Access Memory) 101. FIG. 23 is a section view of the SRAM 101 and illustrates a section taken on a single dot and dash line X-X' of FIG. 22. In FIG. 22 and FIG. 23, a part of constituent elements of the SRAM 101 will be omitted in the illustration.

The SRAM 101 has a silicon substrate 102, active regions 103 to 105, an element isolation insulating film 106, gate electrodes 107A to 107F, a VSS contact 108, a VDD contact 109, and a storage contact 110. In FIG. 22, the VSS contact 108, the VDD contact 109, and the storage contact 110 are illustrated by dotted lines. The gate electrode 107A is a gate electrode included by a transfer transistor. The gate electrodes 107B, 107C are gate electrodes included by a driver transistor. The gate electrodes 107D to 107F are gate electrodes included by a load transistor.

As illustrated in FIG. 22, the silicon substrate 102 has the active regions 103 to 105 formed therein. Further, the semiconductor substrate 2 has the element isolation insulating film 106 formed therein. The active regions 103 to 105 are partitioned by the element isolation insulating film 106. For example, by embedding an oxide film in a groove formed in the silicon substrate 102, the element isolation insulating film 106 is formed in the semiconductor substrate 102. The active region 103 has a first region 103A having a first width and a second region 103B having a second width larger than the first width. Each of the first width and the second width is length in the planar direction of the silicon substrate 102. The gate electrode 107A is formed on the semiconductor substrate 102 in such a way as to straddle (extend over) the first region 103A of the active region 103. The gate electrodes 107B, 107C are formed on the semiconductor substrate 102 in such a way as to straddle the second region 103B of the active region 103. The gate electrode 107D is formed on the semiconductor substrate 102 in such a way as to straddle the active region 105. The gate electrodes 107E, 107F are formed on the semiconductor substrate 102 in such a way as to straddle the active region 104.

When the element isolation insulating film 106 is formed, in the case the oxide film is not sufficiently embedded in the groove between the active region 103 and the active region 104, the element isolation insulating film 106 formed between the active region 103 and the active region 104 has a void made therein. In the case the element isolation insulating film 106 has the void made therein, when the gate electrodes 107A to 107F are formed, polysilicon 111 is embedded in the void of the element isolation insulating film 106. For this reason, as illustrated in FIG. 22, a short circuit may be caused between the gate electrode 107B and the gate electrode 107C or a short circuit may be caused between the gate electrode 107E and the gate electrode 107F.

The present inventors has found that there is the following tendency in a position in which a void is made in the element isolation insulating film 106.

(1) In the case where the active region 103 having a long pattern and the active region 104 having a short pattern are formed in parallel in the silicon substrate 102, the void is made in the element isolation insulating film 106 between the active region 103 and the active region 104.

(2) In the case where the active region 103 has the first region 103A having the first width and the second region 103B having the second width larger than the first width, the void is made in the element isolation insulating film 106 between the second region 103B of the active region 103 and the active region 104.

(3) The void is made in the element isolation insulating film 106 between the gate electrode 107B of the driver transistor and the gate electrode 107C of the driver transistor.

(4) The void is made in the element isolation insulating film 106 between the gate electrode 107E of the load transistor and the gate electrode 107F of the load transistor.

There has been known a technology of forming an epitaxial silicon layer on a high concentration impurity layer to thereby reduce a variation in a threshold voltage. The high concentration impurity layer has micro crystal defects left therein. When the oxide film is embedded, there is a case where metal is introduced into the high concentration impurity layer by metal contamination in a film forming chamber. In this case, the crystal defects are grown greatly by a heat treatment performed thereafter, thereby causing a leak current between a source and a grain.

For example, by repeatedly performing a film forming process and an etching process by a high density plasma (HDP: High Density Plasma) CVD (Chemical Vapor Deposition) method, the performance of embedding the oxide film can be improved. When the number of times of performing the film forming process and the etching process is increased, the amount of metal introduced into the high concentration impurity layer is increased and hence the crystal defects may be more enlarged in some cases. For this reason, in the case where the high concentration impurity layer is formed in the silicon substrate 102, by selecting a film forming method in which the number of times of performing the film forming process and the etching process is decreased, the element isolation insulating film 106 is formed in the silicon substrate 102. However, the film forming method in which the number of times of performing the film forming process and the etching process is decreased is not good in the performance of embedding the oxide film and hence will easily make the voids in the element isolation insulating film 106.

FIG. 24 is a graph to represent a relationship between the amount of exposure and the percent defective of an SRAM at the time of patterning an active region. When the amount of exposure is decreased, the width of a resist pattern for forming an element isolation insulating film will be narrowed. When the width of the resist pattern is narrowed, the width of a groove formed in the silicon substrate is narrowed. As a result, the amount of oxide film embedded is decreased and hence the voids are easily made in the element isolation insulating film, which results in increasing the percent defective of the SRAM. In this way, the defects of the SRAM are caused by the voids made in the element isolation insulating film.

Hereinafter, a semiconductor device and a method for manufacturing the semiconductor device according to the embodiment will be described with reference to the drawings. Constructions of an example 1 and an example 2 are illustrated by way of example, and the semiconductor device and the method for manufacturing the semiconductor device according to the embodiment are not limited to the constructions of the example 1 and the example 2.

[Example 1]

Figure 1:
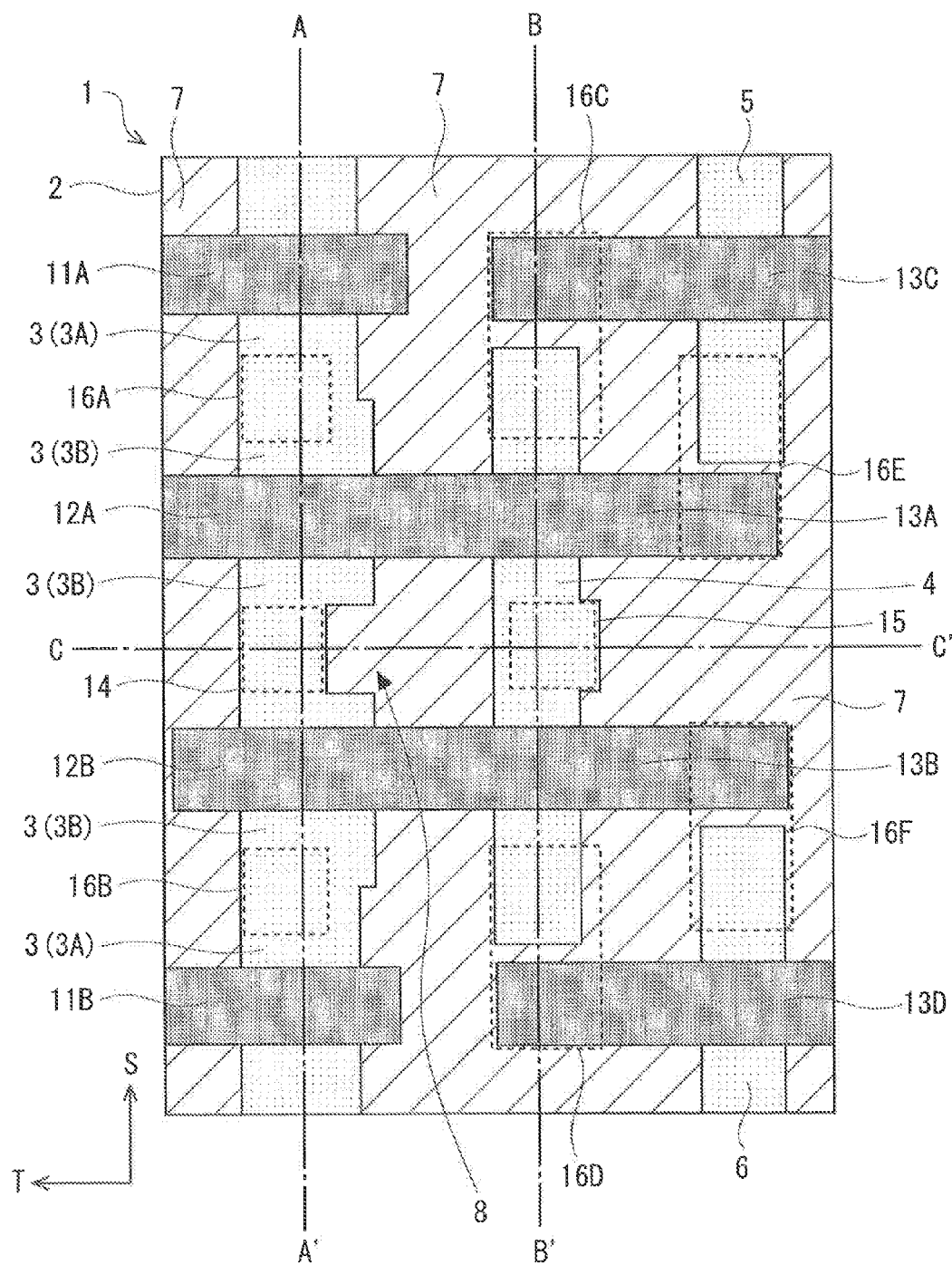
FIG. 1 is a plan view of a semiconductor device 1 according to an example 1.
Figure 2:
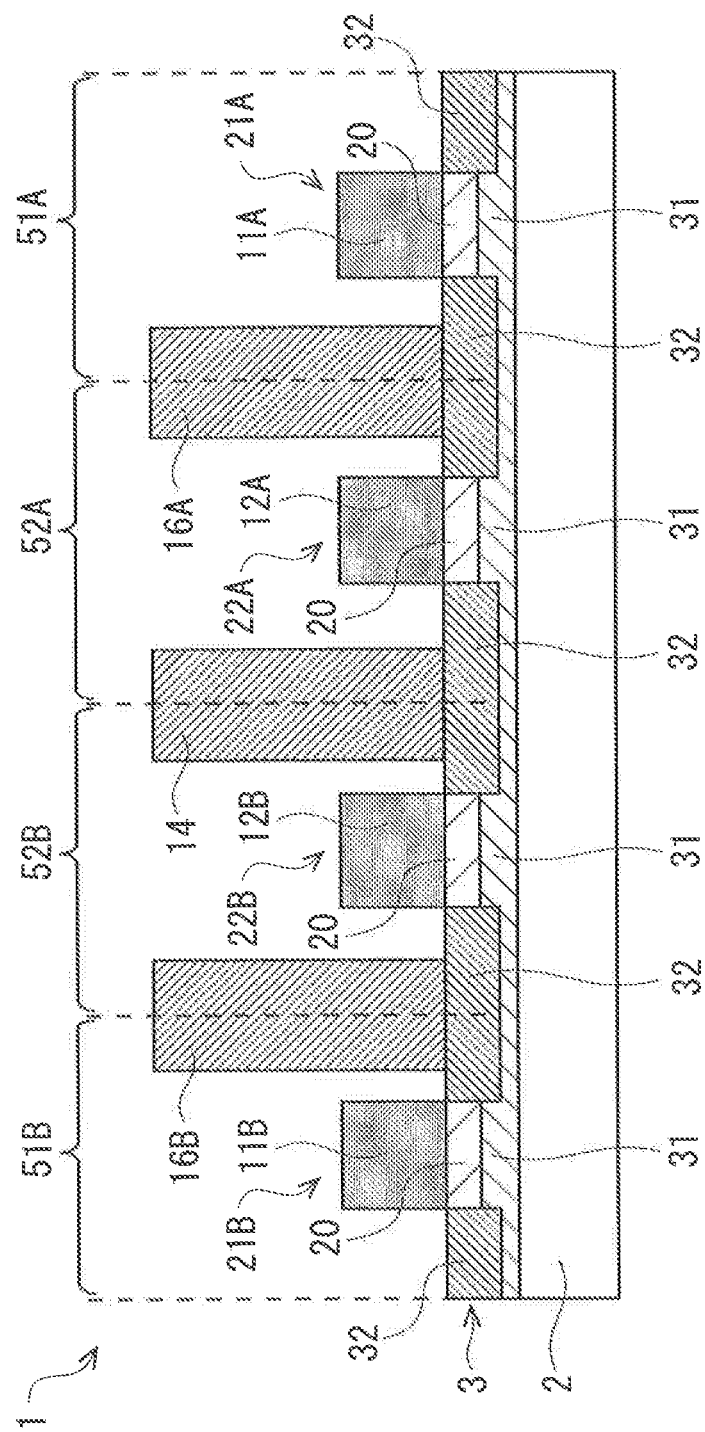
FIG. 2 is a section view of the semiconductor device 1 according to the example 1 and illustrates a section taken on a single dot and dash line A-A' of FIG. 1.
Figure 3:
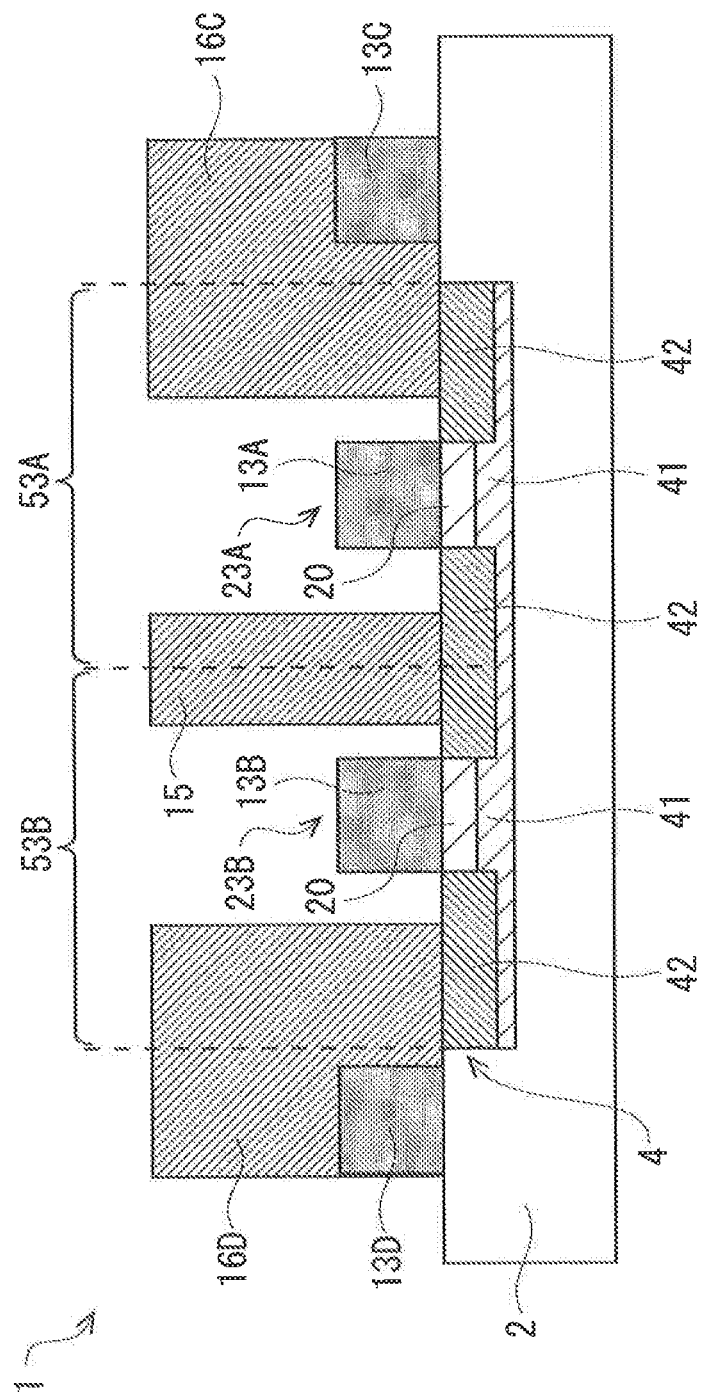
FIG. 3 is a section view of the semiconductor device 1 according to the example 1 and illustrates a section taken on a single dot and dash line B-B' of FIG. 1.

A semiconductor device 1 according to an example 1 will be described with reference to FIG. 1 to FIG. 3. In the example 1, an SRAM, which is an example of the semiconductor device 1, will be described by way of example. FIG. 1 is a plan view of the semiconductor device 1 according to the example 1. FIG. 2 is a section view of the semiconductor device 1 according to the example 1 and illustrates a section taken on a single dot and dash line A-A' of FIG. 1. FIG. 3 is a section view of the semiconductor device 1 according to the example 1 and illustrates a section taken on a single dot and dash line B-B' of FIG. 1. In FIG. 1 to FIG. 3, a part of constituent elements of the semiconductor device 1 will be omitted in the illustration.

As illustrated in FIG. 1, the semiconductor device 1 has a semiconductor substrate 2, active regions 3 to 6, an element isolation insulating film 7, gate electrodes 11A, 11B, 12A, 12B, 13A to 13D, a VSS contact 14, a VDD contact 15, and storage contacts 16A to 16F. In FIG. 1, the VSS contact 14, the VDD contact 15, and the storage contacts 16A to 16F are illustrated by dotted lines. Further, as illustrated in FIG. 2 and FIG. 3, the semiconductor 1 has transfer transistors 21A, 21B, driver transistors 22A, 22B, and load transistors 23A, 23B. The transfer transistors 21A, 21B and the driver transistors 22A, 22B are N channel type MOS (Metal Oxide Semiconductor) transistors. The load transistors 23A, 23B are P channel type MOS transistors.

The semiconductor substrate 2 is, for example, a silicon (Si) substrate. The semiconductor substrate 2 is an example of "a substrate". As illustrated in FIG. 1, the semiconductor substrate 2 has the active regions 3 to 6 formed therein. Further, the semiconductor substrate 2 has the element isolation insulating film 7 formed therein. The active regions 3 to 6 are partitioned by the element isolation insulating film 7. For example, by embedding an oxide film in a groove formed in the semiconductor substrate 2, the element isolation insulating film 7 is formed in the semiconductor substrate 2. The active regions 3, 4 extend in a first direction S. The active region 3 is an example of "a first active region". The active region 4 is an example of "a second active region". The first direction S is a planar direction of the semiconductor substrate 2 and is perpendicular to a direction of the gate electrodes 11A, 11B, 12A, 12B. In other words, the first direction S is a gate length direction of the gate electrodes 11A, 11B, 12A, 12B.

The active region 3 has a first region 3A having a first width and a second region 3B having a second width larger than the first width. Each of the first width and the second width is length in the planar direction of the semiconductor device 2. The gate electrodes 11A, 11B are formed on the semiconductor substrate 2 in such a way as to straddle the first region 3A of the active region 3. The gate electrodes 12A, 12B are formed on the semiconductor substrate 2 in such a way as to straddle the second region 3B of the active region 3. The gate electrodes 13A, 13B are formed on the semiconductor substrate 2 in such a way as to straddle the active region 4. The gate electrode 12A and the gate electrode 13A are connected to each other. That is, the gate electrode 12A and the gate electrode 13A are integrally formed. The gate electrode 12B and the gate electrode 13B are connected to each other. That is, the gate electrode 12B and the gate electrode 13B are integrally formed.

The active regions 3 and 4 are formed in the semiconductor substrate 2 in such a way that the second region 3B of the active region 3 and the active region 4 extend in parallel to each other. The second region 3B of the active region 3 has a depressed part 8 depressed in perpendicular to a second direction T of the first direction S in a plan view. The second direction T is a planar direction of the semiconductor substrate 2 and is a direction separated from the active region 4. Since the second region 3B of the active region 3 has the depressed part 8, the amount of an oxide film, which is embedded in the groove of the semiconductor substrate 2 between the second region 3B of the active region 3 and the active region 4, is increased. Since the amount of the oxide film, which is embedded in the groove of the semiconductor substrate 2 between the second region 3B of the active region 3 and the active region 4 is increased, it is possible to prevent a void from being made in the element isolation insulating film 7 formed between the second region 3B of the active region 3 and the active region 4. Since the second region 3B of the active region 3 has the depressed part 8, it is possible to ensure the channel widths of the gate electrodes 12A, 12B and at the same time to prevent the void from being made in the element isolation insulating film 7 formed between the second region 3B of the active region 3 and the active region 4.

As illustrated in FIG. 2, the gate electrode 11A is formed on the semiconductor substrate 2 in a region (transfer transistor forming region) 51A in which the transfer transistor 21A is formed. The gate electrode 11B is formed on the semiconductor substrate 2 in a region (transfer transistor forming region) 51B in which the transfer transistor 21B is formed. The gate electrode 12A is formed on the semiconductor substrate 2 in a region (driver transistor forming region) 52A in which the driver transistor 22A is formed. The gate electrode 12B is formed on the semiconductor substrate 2 in a region (driver transistor forming region) 52B in which the driver transistor 22B is formed.

As illustrated in FIG. 1, the gate electrode 11A of the transfer transistor 21A and the gate electrode 11B of the transfer transistor 21B are formed on the first region 3A of the active region 3. The gate electrode 12A of the driver transistor 22A and the gate electrode 12B of the driver transistor 22B are formed on the second region 3B of the active region 3. The current drive capacities of the driver transistors 22A, 22B are larger than the current drive capacities of the transfer transistors 21A, 21B, respectively. For this reason, the channel widths (gate widths) of the gate electrode 12A of the driver transistor 22A and the gate electrode 12B of the driver transistor 22B are larger than the channel widths of the gate electrode 11A of the transfer transistor 21A and the gate electrode 11B of the transfer transistor 21B, respectively. Hence, the width of the second region 3B of the active region 3 is larger than the width of the first region 3A of the active region 3.

As illustrated in FIG. 3, the gate electrode 13A is formed on the semiconductor substrate 2 in a region (load transistor forming region) 53A in which the load transistor 23A is formed. The gate electrode 13B is formed on the semiconductor substrate 2 in a region (load transistor forming region) 53B in which the load transistor 23B is formed. The transfer transistors 21A, 21B, the driver transistors 22A, 22B, and the load transistors 23A, 23B functions as a whole as one memory cell in the SRAM. As illustrated in FIG. 1, the gate electrode 13C is formed on the semiconductor substrate 2 in such a way as to straddle the active region 5. The gate electrode 13D is formed on the semiconductor substrate 2 in such a way as to straddle the active region 6. The gate electrodes 13C, 13D are formed on the semiconductor substrate 2 in a region in which the load transistors are formed.

As illustrated in FIG. 2, the active region 3 has an epitaxial silicon layer 20, a P type high concentration impurity layer 31, and an N type source-drain region 32 formed therein. "The epitaxial silicon layer 20" is an example of "an epitaxial layer". The P type high concentration impurity layer 31 is a diffusion layer for controlling a threshold voltage and a punch through stop layer for preventing punch through. As illustrated in FIG. 3, the active region 4 has the epitaxial silicon layer 20, an N type high concentration impurity layer 41, and a P type source-drain region 42 formed therein. The N type high concentration impurity layer 41 is a diffusion layer for controlling a threshold voltage and a punch through stop layer for preventing punch through.

As illustrated in FIG. 1, the VSS contact 14 is formed on the active region 3 (3B) between the gate electrode 12A and the gate electrode 12B. The VSS contact 14 is a ground contact for impressing a ground voltage (reference voltage) to the N type source-drain region 32 of the active region 3. The VSS contact 14 is electrically connected to a ground wiring (not illustrated) formed in the semiconductor substrate 2. The VSS contact 15 is formed on the active region 4 between the gate electrode 13A and the gate electrode 13B. The VSS contact 15 is a power source contact for impressing a power source voltage to the P type source-drain region 42 of the active region 4. The VSS contact 15 is electrically connected to a power source wiring (not illustrated) formed in the semiconductor substrate 2.

The active region 3 between the gate electrode 11A and the gate electrode 12A has the storage contact 16A formed thereon. The active region 3 between the gate electrode 11B and the gate electrode 12B has the storage contact 16B formed thereon. The active region 4 and the gate electrode 13C have the common storage contact 16C formed thereon. The active region 4 and the gate electrode 13D have the common storage contact 16D formed thereon. The active region 5 and the gate electrode 13A have the common storage contact 16E formed thereon. The active region 6 and the gate electrode 13B have the common storage contact 16F formed thereon. The storage contacts 16A to 16F are contacts connected to a storage node (storage part).

[Example 2]

A semiconductor device 1 according to an example 2 will be described with reference to FIG. 4. In the example 2, an SRAM, which is an example of the semiconductor device 1, will be described by way of example. In the example 2, the same constituent elements as in the example 1 will be denoted by the same reference numerals as in the example 1 and their descriptions will be omitted.

Figure 4:
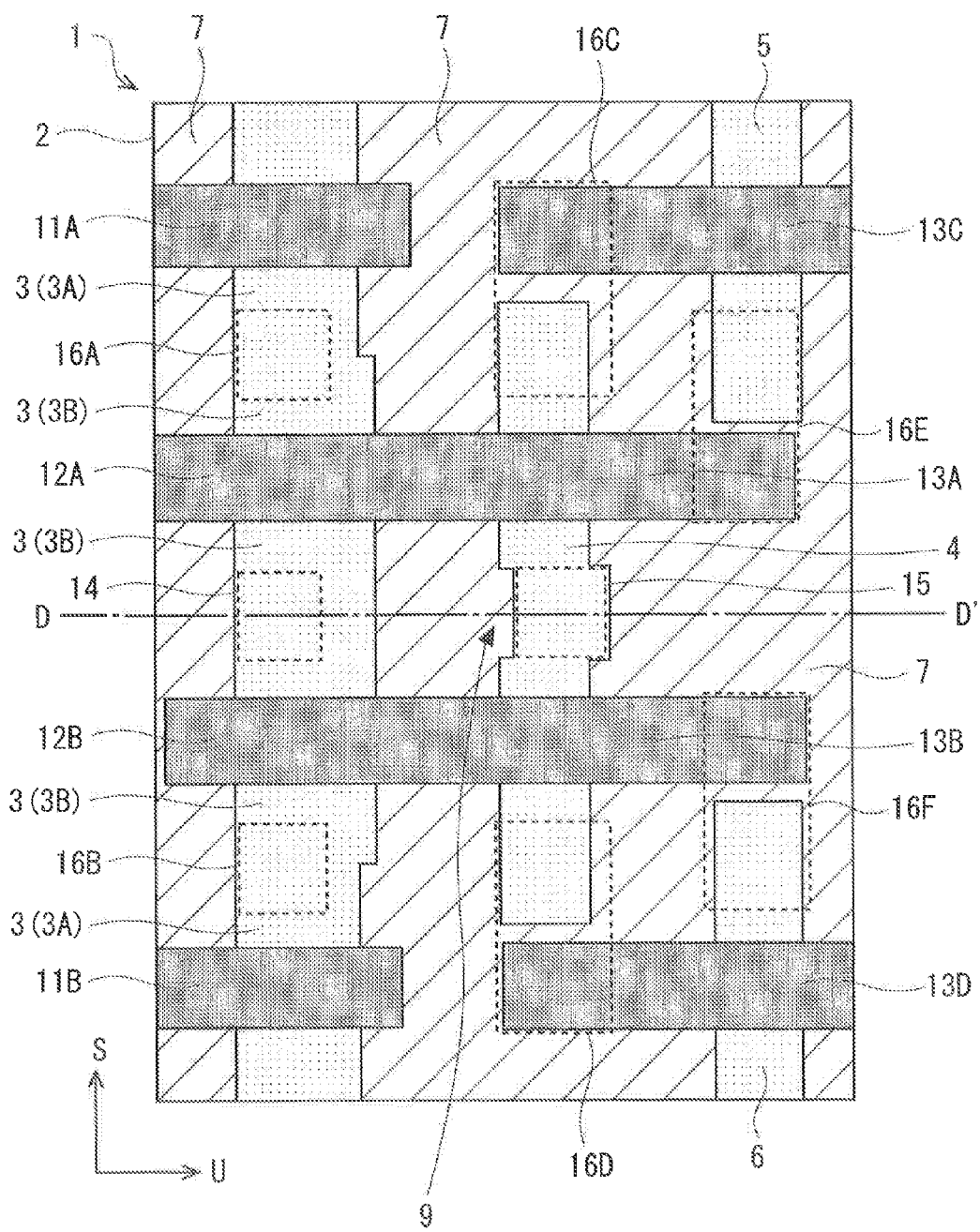
FIG. 4 is a plan view of a semiconductor device 1 according to an example 2.

FIG. 4 is a plan view of the semiconductor device 1 according to the example 2. In FIG. 4, a part of constituent elements of the semiconductor device 1 will be omitted in the illustration. As illustrated in FIG. 4, the semiconductor device 1 has a semiconductor substrate 2, active regions 3 to 6, an element isolation insulating film 7, gate electrodes 11A, 11B, 12A, 12B, 13A to 13D, a VSS contact 14, a VDD contact 15, and storage contacts 16A to 16F. In FIG. 4, the VSS contact 14, the VDD contact 15, and the storage contacts 16A to 16F are illustrated by dotted lines.

As illustrated in FIG. 4, the semiconductor substrate 2 has the active regions 3 to 6 formed therein. Further, the semiconductor substrate 2 has the element isolation insulating film 7 formed therein. The active regions 3 to 6 are partitioned by the element isolation insulating film 7. The active regions 3, 4 extend in a first direction S. The first direction S is a planar direction of the semiconductor substrate 2 and is perpendicular to a direction of the gate electrodes 11A, 11B, 12A, 12B. In other words, the first direction S is a gate length direction of the gate electrodes 11A, 11B, 12A, 12B.

The active region 3 has a first region 3A having a first width and a second region 3B having a second width larger than the first width. The gate electrodes 11A, 11B are formed on the semiconductor substrate 2 in such a way as to straddle the first region 3A of the active region 3. The gate electrodes 12A, 12B are formed on the semiconductor substrate 2 in such a way as to straddle the second region 3B of the active region 3. The gate electrodes 13A, 13B are formed on the semiconductor substrate 2 in such a way as to straddle an active region 4. The gate electrode 12A and the gate electrode 13A are connected to each other. That is, the gate electrode 12A and the gate electrode 13A are integrally formed. The gate electrode 12B and the gate electrode 13B are connected to each other. That is, the gate electrode 12B and the gate electrode 13B are integrally formed.

The active regions 3, 4 are formed in the semiconductor substrate 2 in such a way that the second region 3B of the active region 3 and the active region 4 extend in parallel to each other. The active region 4 has a depressed part 9 depressed in a second direction U perpendicular to the first direction S in a plan view. The second direction U is a planar direction of the semiconductor substrate 2 and is a direction separated from the active region 3. Since the active region 4 has the depressed part 9, the amount of an oxide film, which is embedded in the groove of the semiconductor substrate 2 between the second region 3B of the active region 3 and the active region 4, is increased. Since the amount of the oxide film, which is embedded in the groove of the semiconductor substrate 2 between the second region 3B of the active region 3 and the active region 4 is increased, it is possible to prevent a void from being made in the element isolation insulating film 7 formed between the second region 3B of the active region 3 and the active region 4. Since the active region 4 has the depressed part 9, it is possible to ensure the channel widths of the gate electrodes 13A, 13B and at the same time to prevent the void from being made in the element isolation insulating film 7 formed between the second region 3B of the active region 3 and the active region 4.

<Manufacturing Method>

Figure 5:
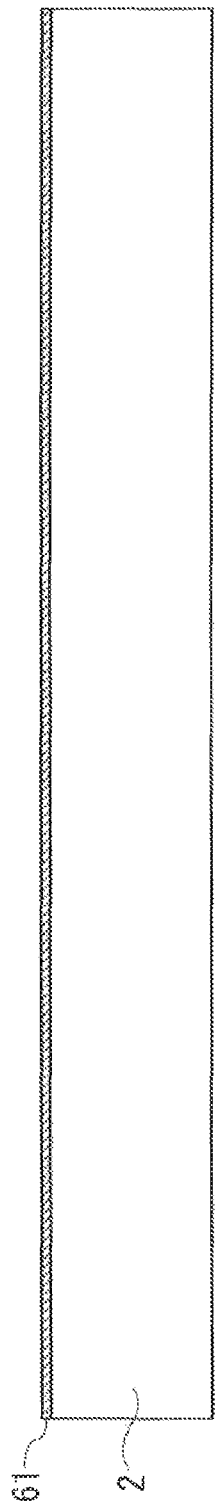
FIG. 5 is a section view to illustrate a method for manufacturing a semiconductor device 1 according to the embodiment.

A method for manufacturing a semiconductor device 1 according to the embodiment will be described. FIG. 5 to FIG. 17C are section views to illustrate the method for manufacturing the semiconductor device 1 according to the embodiment. In the method for manufacturing the semiconductor device 1 according to the embodiment, first, in a process illustrated in FIG. 5, a silicon oxide film ($SiO_2$ film) 61 is formed on the entire face of the semiconductor substrate 2, for example, by a thermal oxidation method. The silicon oxide film 61 is a protective film of the surface of the semiconductor substrate 2. FIG. 5 corresponds to a section portion taken on a single dot and dash line C-C' of FIG. 1 and to a section portion taken on a single dot and dash line D-D' of FIG. 4.

Figure 6:
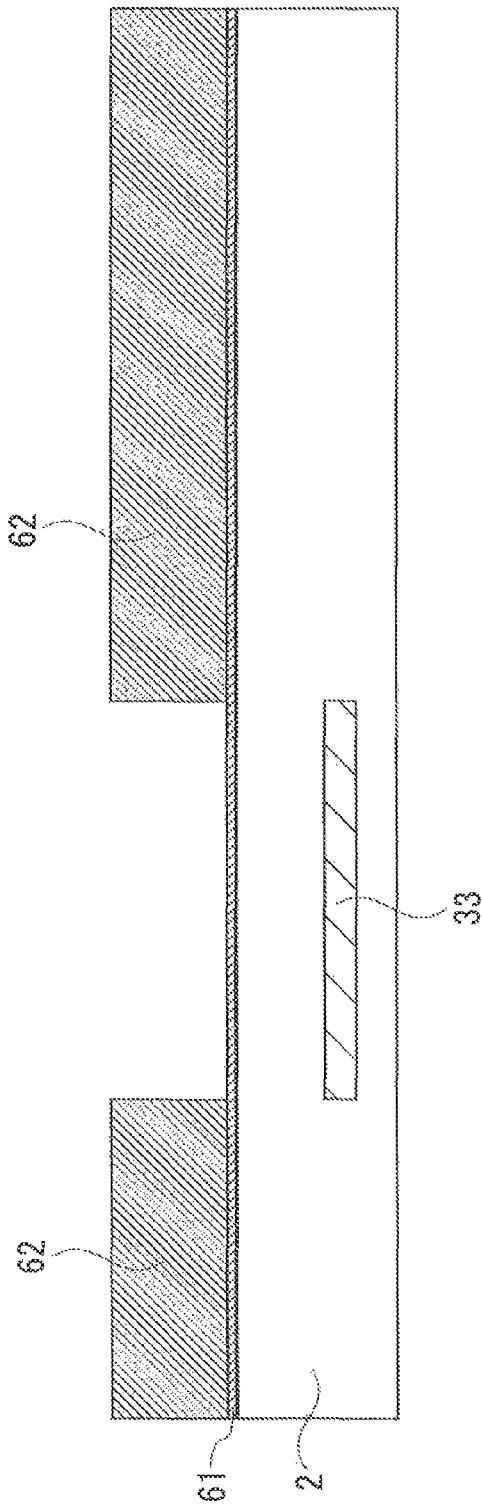
FIG. 6 is a section view to illustrate the method for manufacturing a semiconductor device 1 according to the embodiment.

Next, in a process illustrated in FIG. 6, by photolithography, a region (NMOS transistor forming region) in which an NMOS transistor is formed in the semiconductor substrate 2 is exposed and a photoresist film 62 for covering the other region is formed.

Next, ions are implanted by using the photoresist film 62 as a mask to thereby form an embedded N well 33 in the NMOS transistor forming region in the semiconductor substrate 2. For example, by implanting the ions under the following conditions, the embedded N well 33 may be formed in the semiconductor substrate 2.

Ion Species: Phosphorus Ion ($P^{30}$), Acceleration Energy: 700 keV, Dose Amount: $1.5 \times 10^{13}$ $cm^{-2}$ Next, for example, by a wet treatment using a chemical agent or an ashing treatment, the photoresist film 62 is removed. Next, for example, by a wet etching using a hydrofluoric acid solution, the silicon oxide film 61 is removed. Then, in a process illustrated in FIG. 7, by the photolithography, the NMOS transistor forming region in the semiconductor substrate 2 is exposed and a photoresist film 63 for covering the other region is formed.

Next, ions are implanted by using the photoresist film 63 as a mask to thereby form a P well 34 and a P type high concentration impurity layer 31 in the NMOS transistor forming region in the semiconductor substrate 2. For example, by implanting the ions respectively from four directions slanted to a direction normal to the substrate under the following conditions, the P well 34 may be formed in the semiconductor substrate 2.

Ion Species: Boron Ion ($B^+$), Acceleration Energy: 150 keV, Dose Amount: $7.5 \times 10^{12}$ $cm^{-2}$ For example, by implanting ions respectively under the following conditions, the P type high concentration impurity layer 31 may be formed in the semiconductor substrate 2.
(1) Ion species: germanium ion ($Ge^+$), acceleration energy: 20 to 30 keV, dose amount: 3.0 to $5.0 \times 10^{14}$ $cm^{-2}$
(2) Ion species: carbon ion ($C^+$), acceleration energy: 3 to 6 keV, dose amount: 3.0 to $5.0 \times 10^{14}$ $cm^{-2}$
(3) Ion species: boron ion, acceleration energy: 20 keV, dose amount: 1.6 to $2.0 \times 10^{13}$ $cm^{-2}$
(4) Ion species: boron fluoride, acceleration energy: 25 keV, dose amount: 4.0 to $8.0 \times 10^{12}$ $cm^{-2}$
(5) Ion species: boron fluoride, acceleration energy: 10 keV, dose amount: 1.0 to $3.0 \times 10^{12}$ $cm^{-2}$ The germanium ion functions in the following manner: that is, the germanium ion makes the semiconductor substrate 2 amorphous, thereby preventing boron ion channeling and increasing the probability at which carbon is arranged at a lattice point. The carbon arranged at the lattice point functions in such a way as to prevent the boron ions from being diffused. From this point of view, it is preferable that the germanium ions are implanted before the carbon ions and the boron ions are implanted. Further, it is preferable that the P well 34 is formed before the P type high concentration impurity layer 31 is formed. Next, for example, by the wet treatment using the chemical agent or the ashing treatment, the photoresist film 63 is removed.

Next, in a process illustrated in FIG. 8, a heat treatment is performed in an inactive atmosphere to thereby recover the damage that the semiconductor substrate 2 suffers by the ion implantation. For example, in a nitrogen atmosphere, the heat treatment with a processing temperature of approximately 585 to 615° C. and a processing time of approximately 150 seconds is performed. Then, the surface of the semiconductor substrate 2 is wetly oxidized under a reduced pressure by an ISSG (In-Situ Steam Generation) oxidation method to thereby form a silicon oxide film 64 having a film thickness of, for example, approximately 3 nm on the semiconductor substrate 2. As for the processing conditions of the ISSG oxidation method, a processing temperature with, for example, approximately 750 to 810° C. and a processing time of, for example, approximately 20 minutes may be set.

Next, by the photolithography, a region (PMOS transistor forming region) in which a P type MOS transistor is formed in the semiconductor substrate 2 is exposed and a photoresist film 65 for covering the other region is formed.

Next, ions are implanted by using the photoresist film 65 as a mask to thereby form an N well 43 and an N type high concentration impurity layer 41 in the PMOS transistor forming region in the semiconductor substrate 2. For example, by implanting the ions respectively from four directions slanted to a normal direction of the substrate under the following conditions, the N well 43 may be formed in the semiconductor substrate 2.

Ion Species: Phosphorus Ion, Acceleration Energy: 360 keV, Dose Amount: $7.5 \times 10^{12}$ $cm^{-2}$ For example, by implanting the ions respectively from four directions slanted to the normal direction of the substrate under the following conditions (1) and (2) and then by implanting the ions under the following conditions (3), the N type high concentration impurity layer 41 may be formed in the semiconductor substrate 2.
(1) Ion species: antimony ion ($Sb^+$), acceleration energy: 80 keV, dose amount: $3.0 \times 10^{12}$ $cm^{-2}$
(2) Ion species: antimony ion, acceleration energy: 130 keV, dose amount: $1.5 \times 10^{12}$ $cm^{-2}$
(3) Ion species: antimony ion, acceleration energy: 20 keV, dose amount: 4.0 to $8.0 \times 10^{12}$ $cm^{-2}$ Next, for example, by the wet treatment using the chemical agent or the ashing treatment, the photoresist film 65 is removed. Next, for example, by the wet etching using the hydrofluoric acid solution, the silicon oxide film 64 is removed. Then, the surface of the semiconductor substrate 2 is wetly oxidized under the reduced pressure by the ISSG oxidation method to thereby form a silicon oxide film (not illustrated) having a film thickness of, for example, approximately 3 nm on the semiconductor substrate 2. As for the processing conditions of the ISSG oxidation method, for example, a processing temperature of approximately 750 to 810° C. and a processing time of approximately 20 minutes may be set. The reason why the silicon oxide film is formed on the semiconductor substrate 2 is to recover the damage that the semiconductor substrate 2 has suffered. Next, for example, by the wet etching using the hydrofluoric acid solution, the silicon oxide film is removed.

Next, in a process illustrated in FIG. 9, for example, by a wet etching using TMAH (Tetramethylammonium hydroxide), the surface of the semiconductor substrate 2 is etched by a thickness of approximately 3 nm. Then, for example, by a CVD (Chemical Vapor Deposition) method, a silicon layer having a film thickness of, for example, approximately 25 nm is epitaxially grown on the surface of the semiconductor substrate 2. In this way, an epitaxial silicon layer 20 is formed on the semiconductor substrate 2. Then, under the reduced pressure by the ISSG oxidation method, the surface of the silicon layer 20 is wetly oxidized, whereby a silicon oxide film 66 having a film thickness of, for example, approximately 3 nm is formed on the epitaxial silicon layer 20. As for the processing conditions of the ISSG oxidation method, for example, a processing temperature of approximately 750 to 810° C. and a processing time of approximately 20 seconds may be set. Then, for example, by an LP (Low Pressure) CVD method, a silicon nitride film (SiN) 67 having a film thickness of, for example, approximately 50 to 90 nm is formed on the silicon oxide film 66. As for the processing conditions of the LPCVD method, for example, a temperature of approximately 700° C. and a processing time of approximately 150 minutes may be set.

Next, in a process illustrated in FIG. 10, by the photolithography, a photoresist film 68 is formed on the silicon nitride film 67. Then, an anisotropic dry etching is performed by using the photoresist film 68 as a mask, whereby the silicon nitride film 67, the silicon oxide film 66, the epitaxial silicon layer 20, and the semiconductor substrate 2 are etched in sequence. In this way, an element isolation groove 69 is formed between the respective transistor forming regions in the semiconductor substrate 2. Then, for example, by the wet treatment or the ashing treatment using the chemical agent, the photoresist film 68 is removed.

Figure 11:
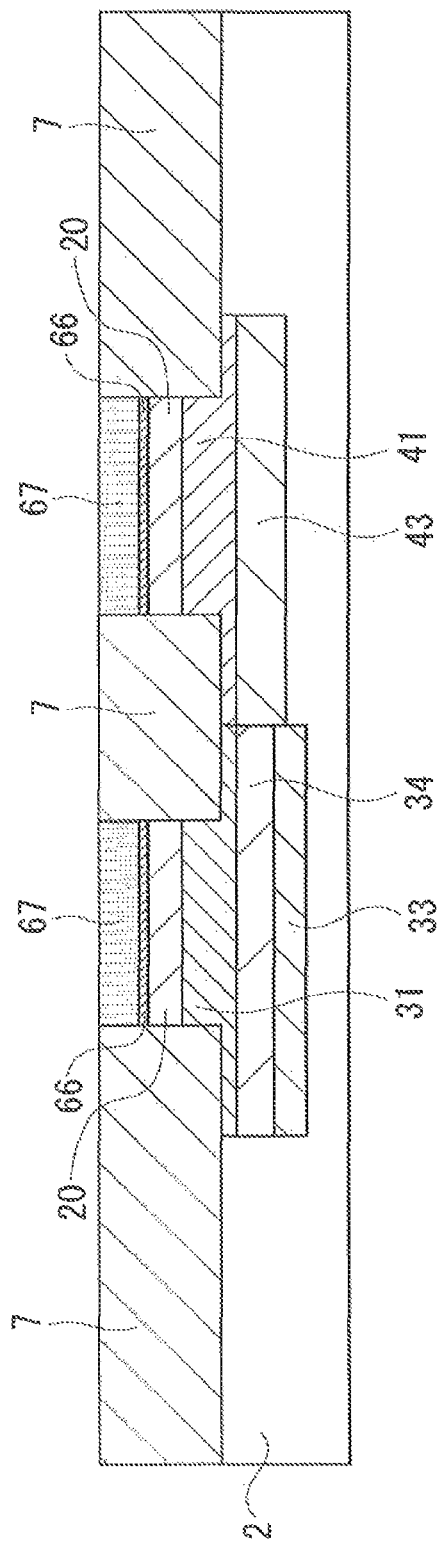
FIG. 11 is a section view to illustrate the method for manufacturing a semiconductor device 1 according to the embodiment.

Next, in a process illustrated in FIG. 11, by the use of a thermal oxidation method, the surfaces of the epitaxial silicon layer 20 and the semiconductor substrate 2 are wetly oxidized to thereby form a silicon oxide film having a film thickness of, for example, approximately 10 nm as a liner film on an inner wall of the element isolation groove 69. As for the treatment conditions for forming the silicon oxide film on the inner wall of the element isolation groove 69, for example, a processing temperature of approximately 650 to 750 ° C. and a processing time of approximately 40 minutes may be set. Then, for example, by a high density plasma CVD method, a silicon oxide film having a film thickness of, for example, approximately 500 nm is deposited on the entire face of the semiconductor substrate 2, whereby a silicon oxide film is embedded in the element isolation groove 69. Then, for example, by a CMP (Chemical Mechanical Polishing) method, the silicon oxide film on the silicon nitride film 67 is removed. By a so-called STI (Shallow Trench Isolation) method, the silicon oxide film is embedded in the element isolation groove 69, whereby the element isolation insulating film 7 is formed on the semiconductor substrate 2.

Figure 12:
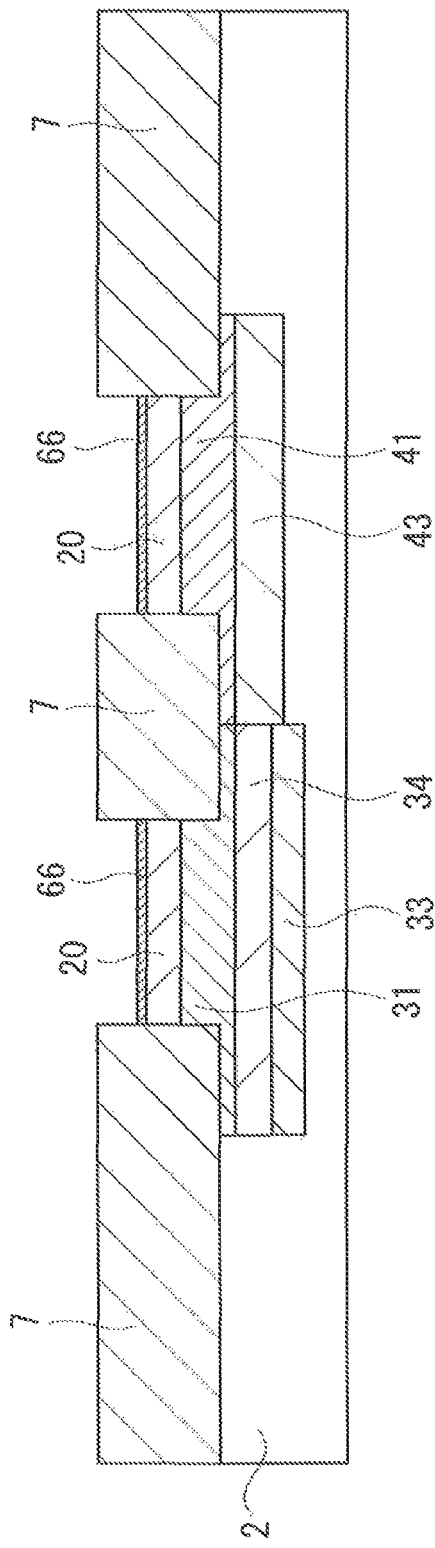
FIG. 12 is a section view to illustrate the method for manufacturing a semiconductor device 1 according to the embodiment.

Next, in a process illustrated in FIG. 12, for example, by a wet etching using a hot phosphoric acid, the silicon nitride film 67 is removed.

Figure 13A:
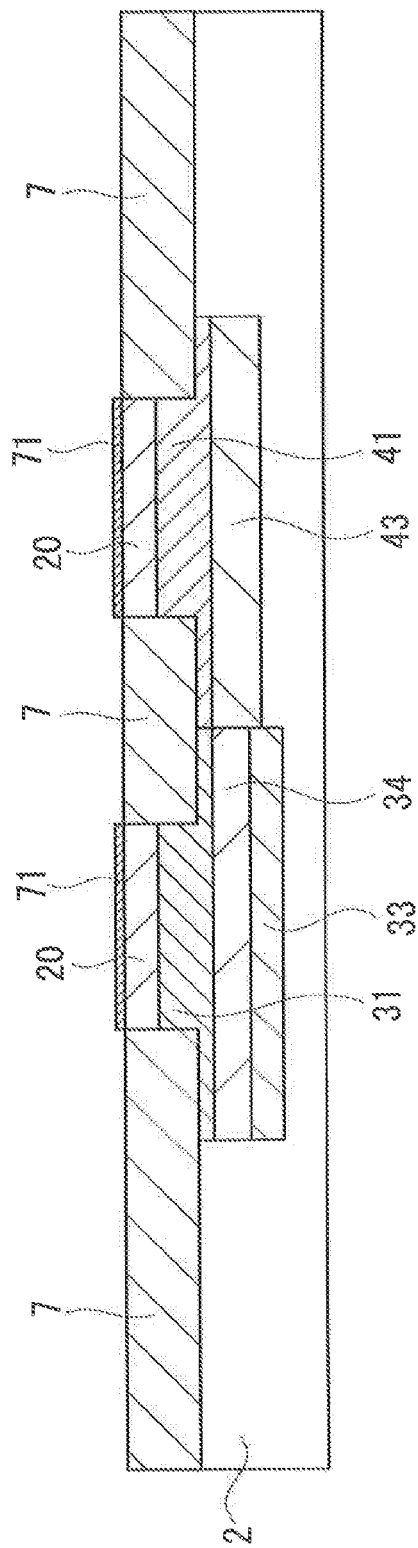
FIG. 13A is a section view to illustrate the method for manufacturing a semiconductor device 1 according to the embodiment.
Figure 13C:
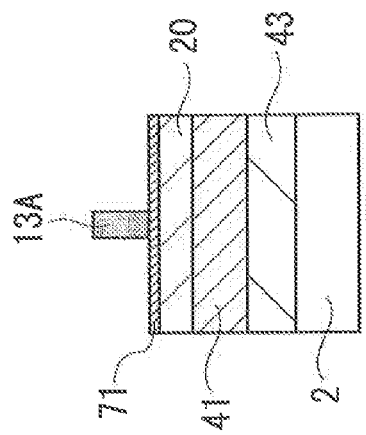
FIG. 13C is a section view to illustrate the method for manufacturing a semiconductor device 1 according to the embodiment.
Figure 13B:
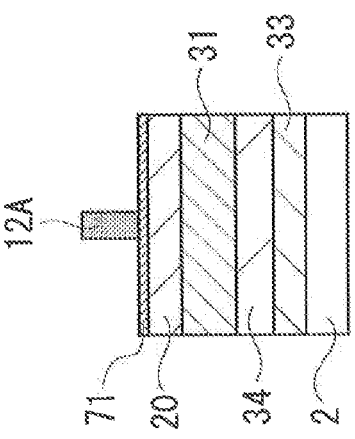
FIG. 13B is a section view to illustrate the method for manufacturing a semiconductor device 1 according to the embodiment.

Next, in processes illustrated in FIG. 13A to 13C, for example, by the wet etching using the hydrofluoric acid solution, the silicon oxide film 66 is removed and the top portion of the element isolation insulating film 7 is removed. In this way, the height of the surface of the element isolation insulating film 7 is made nearly equal to the height of the surface of the epitaxial silicon layer 20. FIG. 13A corresponds to a section part taken on a single dot and dash line C-C' of FIG. 1 and to a section part taken on a single dot and dash line D-D' of FIG. 4. FIG. 13B corresponds to a portion of a section taken on a single dot and dash line A-A' of FIG. 1. FIG. 13C corresponds to a portion of a section taken on a single dot and dash line B-B' of FIG. 1.

Next, for example, by the thermal oxidation method, a gate insulating film 71 having a film thickness of, for example, approximately 2 nm is formed on the epitaxial silicon layer 20. The gate insulating film 71 is, for example, a silicon oxide film. As for the treatment conditions for forming the gate insulating film 71, for example, a processing temperature of approximately 810° C. and a processing time of approximately 8 seconds may be set. Then, by performing a heat treatment of, for example, a processing temperature of approximately 870° C. and a processing time of approximately 13 seconds in an NO atmosphere, nitrogen may be introduced in the gate insulating film 71. As for a method for introducing nitride, for example, plasma nitriding may be used. Then, a heat treatment of a temperature of approximately 1050° C. and a processing time of approximately 3 seconds is performed. The gate insulating film 71 may be a high dielectric insulating film (high-k film), for example, $HfO_2$, $HfSiO$, $HfAlON$, $Y_2O_3$, $ZrO$, $TiO$, $TaO$ or the like.

Next, for example, by the LPCVD method, a polysilicon film having a film thickness of, for example, approximately 100 nm is deposited on the entire face of the semiconductor substrate 2. As for a treatment condition for forming the polysilicon film, a processing temperature of, for example, approximately 600 to 610 ° C. may be set. Then, by the photolithography and the anisotropic dry etching, the polysilicon film is patterned. By patterning the polysilicon film, gate electrodes 11A, 11B, 12A, 12B, and 13A to 13D are formed in the respective transistor forming regions in the semiconductor substrate 2.

Next, in processes illustrated in FIG. 14A to 14C, by the photolithography, the NMOS transistor forming region in the semiconductor substrate 2 is exposed and a photoresist film (not illustrated) for covering the other region is formed. Then, ions are implanted by using the photoresist film and the gate electrodes 11A, 11B, 12A, 12B as masks. By selectively implanting the ions, an N type extension region 35 is formed in the NMOS transistor forming region in the semiconductor substrate 2. For example, by implanting the ions under the following conditions, the N type extension region 35 may be formed in the semiconductor substrate 2.

Ion species: arsenic ion, acceleration energy: 1.5 keV, dose amount: $1.0 \times 10^{15}$ $cm^{-2}$ Next, by the photolithography, the PMOS transistor forming region in the semiconductor substrate 2 is exposed and a photoresist film (not illustrated) for covering the other region is formed. Then, ions are implanted by using the photoresist film and the gate electrodes 13A to 13D, as masks. By selectively implanting the ions, a P type extension region 44 is formed in the PMOS transistor forming region in the semiconductor substrate 2. For example, by implanting the ions under the following conditions, the P type extension region 44 may be formed in the semiconductor substrate 2.

Ion Species: Boron Ion, Acceleration Energy: 0.5 Kev, Dose Amount: $3.2 \times 10^{14}$ $cm^{-2}$ Next, in processes illustrated in FIG. 15A to 15C, for example, by the CVD method, a silicon oxide film having a film thickness of, for example, approximately 80 nm is deposited on the entire face of the semiconductor substrate 2. As for a treatment condition for forming the silicon oxide film, a processing temperature of, for example, approximately 500 to 550° C. may be set. Then, the silicon oxide film deposited on the entire face of the semiconductor substrate 2 is subjected to the anisotropic dry etching, whereby the silicon oxide film is left on the side faces (side wall portions) of the gate electrodes 11A, 11B, 12A, 12B, 13A to 13D. In this way, side walls 72 are formed on the side faces of the gate electrodes 11A, 11B, 12A, 12B, and 13A to 13D.

Next, in processes illustrated in FIG. 16A to 16C by the photolithography, the NMOS transistor forming region in the semiconductor substrate 2 is exposed and a photoresist film (not illustrated) for covering the other region is formed. Then, ions are implanted by using the photoresist film and the gate electrodes 11A, 11B, 12A, 12B, and the side walls 72 as masks. In this way, an N type source-drain region 32 is formed in the NMOS transistor forming region in the semiconductor substrate 2, and N type impurities are added to the gate electrodes 11A, 11B, 12A, 12B. For example, the ions may be implanted under the following conditions.

Ion Species: Phosphorus Ion, Acceleration Energy: 8 keV, Dose Amount: $1.2 \times 10^{16}$ cm$^{-2}$ Next, by the photolithography, the PMOS transistor forming region in the semiconductor substrate 2 is exposed and a photoresist film (not illustrated) for covering the other region is formed. Then, ions are implanted by using the photoresist film, the gate electrodes 13A to 13D, and the side walls 72 as masks. In this way, a P type source-drain region 42 is formed in the PMOS transistor forming region in the semiconductor substrate 2, and P type impurities are added to the gate electrodes 13A to 13D. For example, the ions may be implanted under the following conditions.

Ion Species: Boron Ion, Acceleration Energy: 4 Key, Dose Amount: $6.0 \times 10^{15}$ cm$^{-2}$ Next, in an inactive gas atmosphere, for example, a short-time heat treatment of a processing temperature of approximately 1025° C. and a processing time of 0 second is performed, whereby the implanted impurities are activated and diffused in the gate electrodes 11A, 11B, 12A, 12B, and 13A to 13D. The short time heat treatment of a processing temperature of approximately 1025° C. and a processing time of 0 second is sufficient for diffusing the impurities to the interfaces of the gate electrodes 11A, 11B, 12A, 12, 13A to 13D and the gate insulating film 71.

Figure 17C:
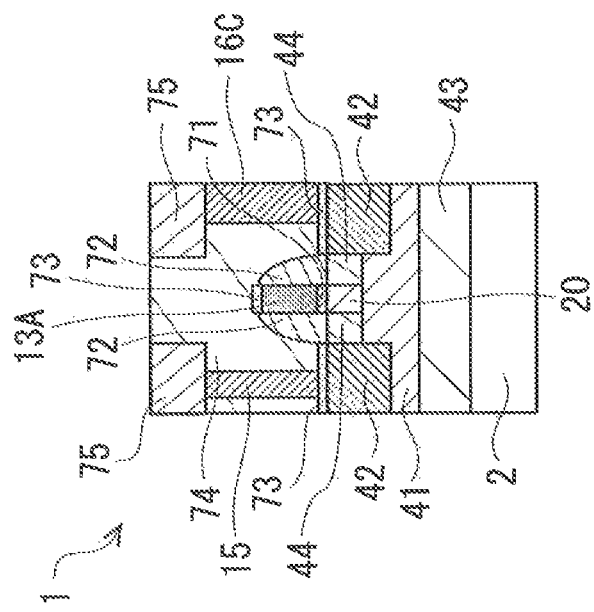
FIG. 17C is a section view to illustrate the method for manufacturing a semiconductor device 1 according to the embodiment.
Figure 17B:
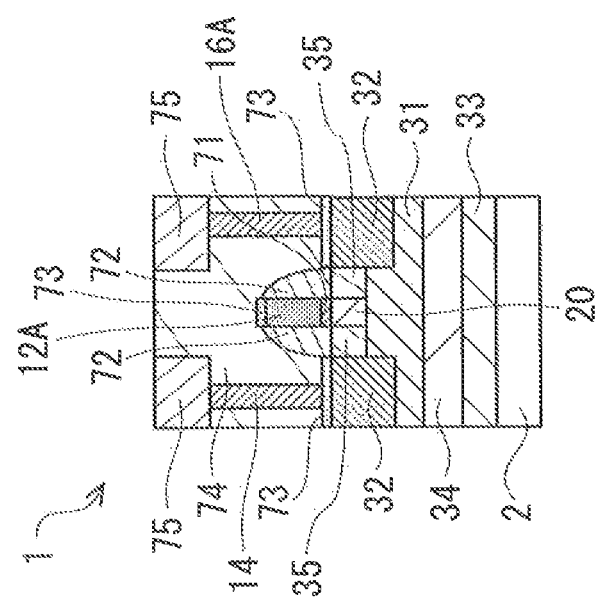
FIG. 17B is a section view to illustrate the method for manufacturing a semiconductor device 1 according to the embodiment.

Next, in processes illustrated in FIG. 17A to 17C, by a silicide process, metal silicide films 73 are formed on the gate electrodes 11A, 11B, 12A, 12B, and 13A to 13D, the N type source-drain region 32, and the P type source-drain region 42. The metal silicide films 73 are, for example, cobalt silicide films. Then, for example, by the CVD method, a silicon nitride film having a film thickness of, for example, approximately 80 nm is deposited on the entire face of the semiconductor substrate 2. The silicon nitride film functions as an etching stopper film. Then, for example, by the high density plasma CVD method, a silicon oxide film having a film thickness of, for example, approximately 500 nm is deposited on the silicon nitride film. In this way, an interlayer insulating film 74, which is a laminated film of the silicon nitride film and the silicon oxide film, is formed on the semiconductor substrate 2.

Next, for example, by the CMP method, the surface of the interlayer insulating film 74 is polished, whereby the interlayer insulating film 74 is planarized. Then, by the photolithography and the anisotropic dry etching, contact holes are formed in the interlayer insulating film 74. Then, a VSS contact 14, a VDD contact 15, and storage contacts 16A, 16B are embedded and formed in the contact holes formed in the interlayer insulating film 74. Then, wirings 75 connected to the VSS contact 14, the VDD contact 15, and the storage contacts 16A, 16B are formed and then a desired back end process is performed. In this way, the semiconductor device 1 is manufactured.

<Mounting Example>

Figure 18:
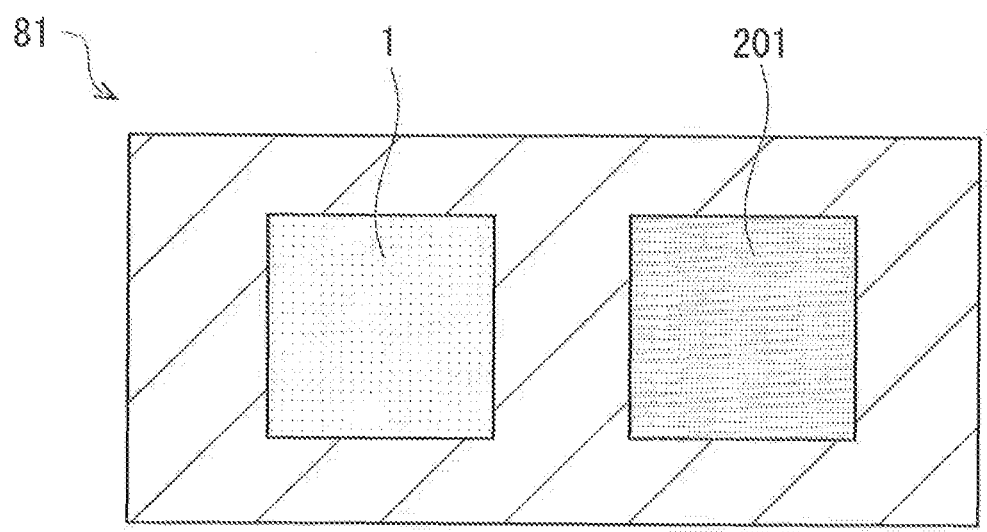
FIG. 18 is a plan view of a printed wiring board 81.
Figure 19:
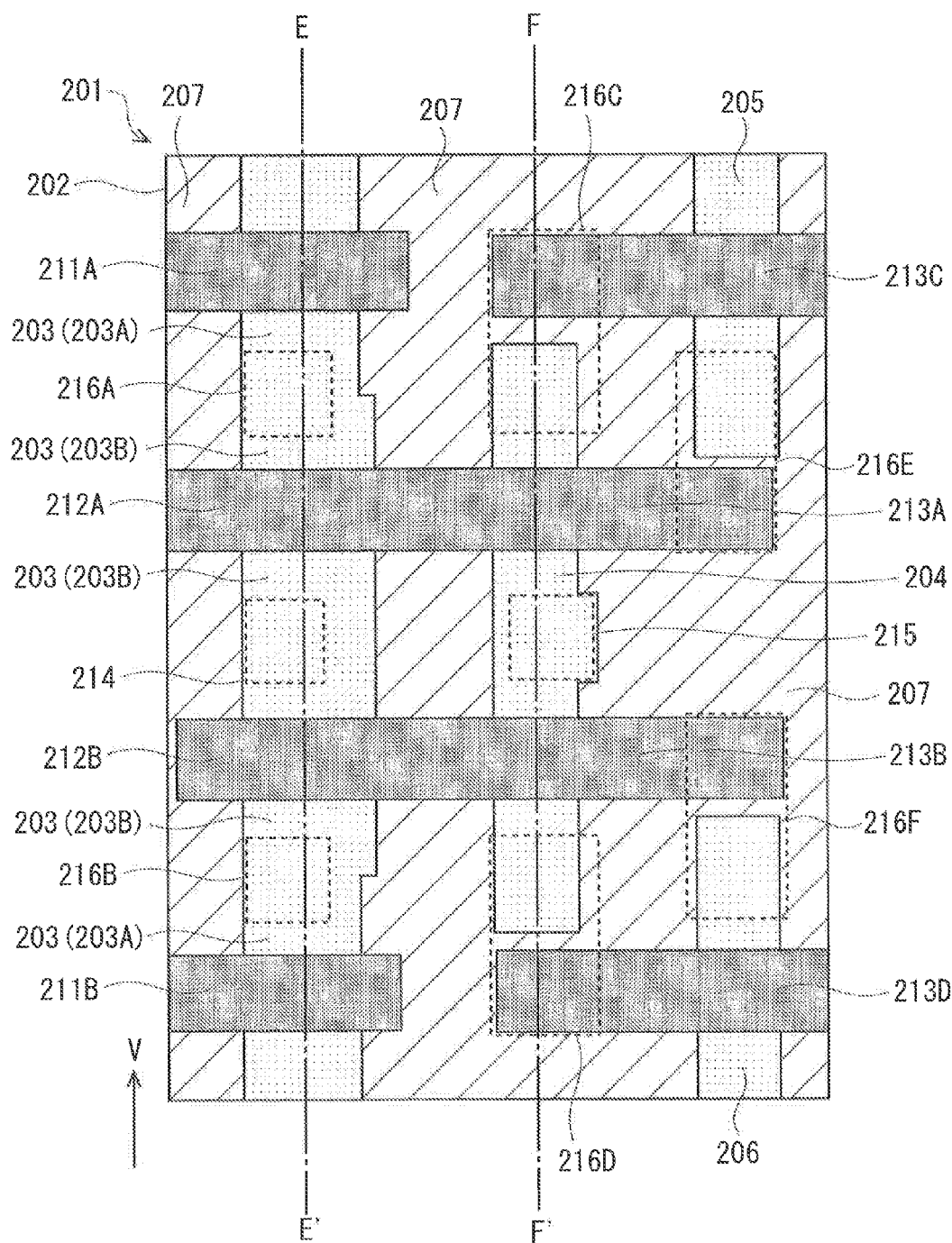
FIG. 19 is a plan view of a semiconductor device 201.
Figure 20:
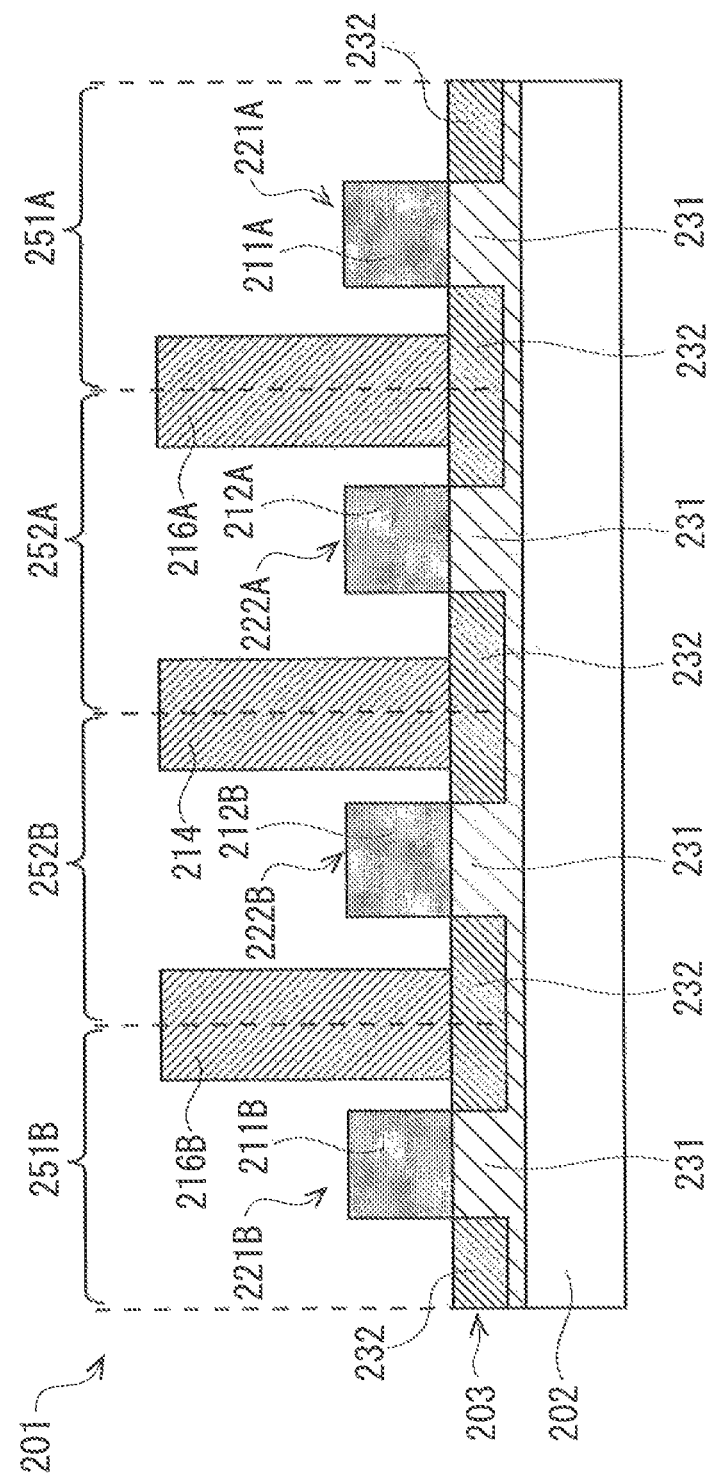
FIG. 20 is a section view of the semiconductor device 201 and illustrates a section taken on a single dot and dash line E-E' of FIG. 19.
Figure 21:
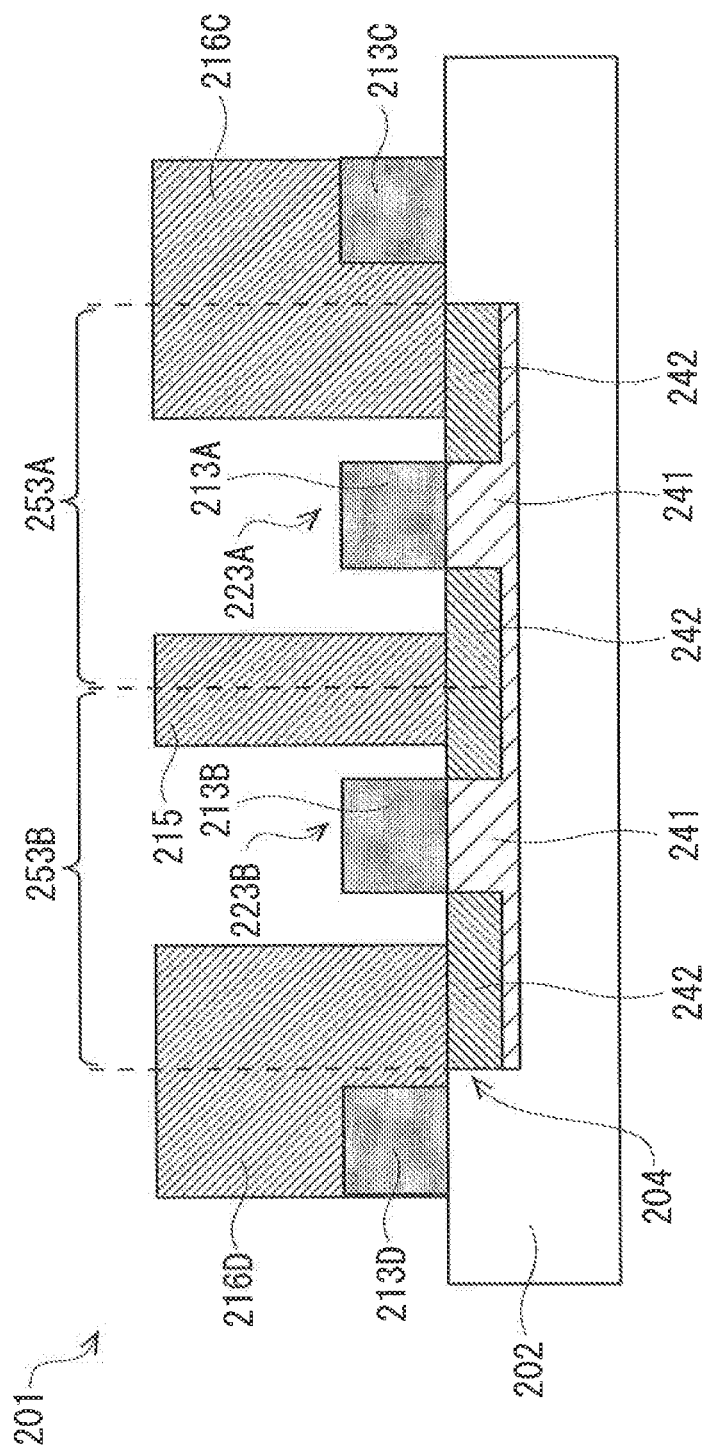
FIG. 21 is a section view of the semiconductor device 201 and illustrates a section taken on a single dot and dash line F-F' of FIG. 19.

FIG. 18 is a plan view of a printed wiring board 81 mounted with a semiconductor device 1, which has an epitaxial silicon layer 20, and a semiconductor device 201, which does not have the epitaxial silicon layer 20. FIG. 19 is a plan view of the semiconductor device 201. FIG. 20 is a section view of the semiconductor device 201 and illustrates a section taken on a single dot and dash line E-E' of FIG. 19. FIG. 21 is a section view of the semiconductor device 201 and illustrates a section taken on a single dot and dash line F-F' of FIG. 19. In FIG. 19 to FIG. 21, a part of constituent elements of the semiconductor device 201 will be omitted in the illustration.

As illustrated in FIG. 19, the semiconductor device 201 has a semiconductor substrate 202, active regions 203 to 206, an element isolation insulating film 207, and gate electrodes 211A, 211B, 212A, 212B, and 213A to 213D. Further, the semiconductor device 201 has a VSS contact 214, a VDD contact 215, and storage contacts 216A to 216F. In FIG. 19, the VSS contact 214, the VDD contact 215, and the storage contacts 216A to 216F are illustrated by dotted lines. Further, as illustrated in FIG. 20 and FIG. 21, the semiconductor device 201 has transfer transistors 221A, 221B, driver transistors 222A, 222B, and load transistors 223A, 223B. The transfer transistors 221A, 221B and the driver transistors 222A, 222B are N channel type MOS transistors. The load transistors 223A, 223B are P channel type MOS transistors.

The semiconductor substrate 202 is, for example, a silicon substrate. The semiconductor substrate 202 is an example of "a second substrate". As illustrated in FIG. 19, the semiconductor substrate 202 has the active regions 203 to 206 formed therein. Further, the semiconductor substrate 202 has the element isolation insulating film 207 formed therein. The element isolation insulating film 207 is an example of "a second element isolation insulating film". The active regions 203 to 206 are partitioned by the element isolation insulating film 207. For example, by embedding an oxide film in a groove formed in the semiconductor substrate 202, the element isolation insulating film 207 is formed in the semiconductor substrate 202. The active regions 203, 204 extend in a third direction V. The active region 203 is an example of "a third active region". The active region 204 is an example of "a fourth active region". The third direction V is a planar direction of the semiconductor substrate 202 and is perpendicular to a direction of the gate electrodes 211A, 211B, 212A, 212B. In other words, the third direction V is a gate length direction of the gate electrodes 211A, 211B, 212A, 212B.

The active region 203 has a third region 203A having a third width and a fourth region 203B having a fourth width larger than the third width. Each of the third width and the fourth width is length in the planar direction of the semiconductor substrate 202. The gate electrodes 211A, 211B are formed on the semiconductor substrate 202 in such a way as to straddle the third region 203A of the active region 203. The gate electrodes 212A, 212B are formed on the semiconductor substrate 202 in such a way as to straddle the fourth region 203B of the active region 203. The gate electrodes 213A, 213B are formed on the semiconductor substrate 202 in such a way as to straddle the active region 204. The gate electrode 212A and the gate electrode 213A are connected to each other. That is, the gate electrode 212A and the gate electrode 213A are integrally formed. The gate electrode 212B and the gate electrode 213B are connected to each other. That is, the gate electrode 212B and the gate electrode 213B are integrally formed. The active regions 203, 204 are formed in the semiconductor substrate 202 in such a way that the fourth region 203B of the active region 203 and the active region 204 extend in parallel to each other.

As illustrated in FIG. 20, the gate electrode 211A is formed on the semiconductor substrate 202 in a region (transfer transistor forming region) 251A in which the transfer transistor 221A is formed. The gate electrode 211B is formed on the semiconductor substrate 202 in a region (transfer transistor forming region) 251B in which the transfer transistor 221B is formed. The gate electrode 212A is formed on the semiconductor substrate 2 in a region (driver transistor forming region) 252A in which the driver transistor 222A is formed. The gate electrode 212B is formed on the semiconductor substrate 2 in a region (driver transistor forming region) 252B in which the driver transistor 222B is formed.

As illustrated in FIG. 19, the gate electrode 211A of the transfer transistor 221A and the gate electrode 211B of the transfer transistor 221B are formed on the third region 203A of the active region 203. The gate electrode 212A of the driver transistor 222A and the gate electrode 212B of the driver transistor 222B are formed on the fourth region 203B of the active region 203. The current drive capacities of the driver transistors 222A, 222B are larger than the current drive capacities of the transfer transistors 221A, 221B, respectively. For this reason, the channel widths of the gate electrode 212A of the driver transistor 222A and the gate electrode 212B of the driver transistor 222B are longer than the channel widths of the gate electrode 211A of the transfer transistor 221A and the gate electrode 211B of the transfer transistor 221B, respectively. Hence, the width of the fourth region 203B of the active region 203 is larger than the width of the third region 203A of the active region 203.

As illustrated in FIG. 21, the gate electrode 213A is formed on the semiconductor substrate 202 in a region (load transistor forming region) 253A in which the load transistor 223A is formed. The gate electrode 213B is formed on the semiconductor substrate 202 in a region (load transistor forming region) 253B in which the load transistor 223B is formed. The transfer transistors 221A, 221B, the driver transistors 222A, 222B, and the load transistors 223A, 223B functions as a whole as one memory cell in an SRAM. As illustrated in FIG. 19, the gate electrode 213C is formed on the semiconductor substrate 202 in such a way as to straddle the active region 205. The gate electrode 213D is formed on the semiconductor substrate 202 in such a way as to straddle the active region 206. The gate electrodes 213C, 213D are formed on the semiconductor substrate 2 in a region in which the load transistors are formed.

As illustrated in FIG. 20, the active region 203 has a P type impurity layer 231 and an N type source-drain region 232 formed therein. The P type impurity layer 231 is a diffusion layer for controlling a threshold voltage. As illustrated in FIG. 21, the active region 204 has an N type impurity layer 241 and a P type source-drain region 242 formed therein. The N type impurity layer 241 is a diffusion layer for controlling a threshold voltage.

As illustrated in FIG. 19, the active region 203 (203B) between the gate electrode 212A and the gate electrode 212B has the VSS contact 214 formed thereon. The VSS contact 214 is a ground contact for impressing a ground voltage (reference voltage) to the N type source-drain region 232 of the active region 203. The VSS contact 214 is electrically connected to a ground line (not illustrated) formed in the semiconductor substrate 202. The active region 204 between the gate electrode 213A and the gate electrode 213B has the VDD contact 215 formed thereon. The VDD contact 215 is a power source contact for impressing a power source voltage to the P type source-drain region 242 of the active region 204. The VDD contact 215 is electrically connected to a power source line (not illustrated) formed in the semiconductor substrate 202.

The active region 203 between the gate electrode 211A and the gate electrode 212A has the storage contact 216A formed thereon. The active region 203 between the gate electrode 211B and the gate electrode 212B has the storage contact 216B formed thereon. The active region 204 and the gate electrode 213C have the common storage contact 216C formed thereon. The active region 204 and the gate electrode 213D have the common storage contact 216D formed thereon. The active region 205 and the gate electrode 213A have the common storage contact 216E formed thereon. The active region 206 and the gate electrode 213B have the common storage contact 216F formed thereon. The storage contacts 216A to 216F are contacts connected to a storage node (storage part).

As illustrated in FIG. 18, the printed wiring board 81 has the semiconductor device 1, which has the epitaxial silicon layer 20, and the semiconductor device 201, which does not have the epitaxial silicon layer 20. The semiconductor device 1 and the semiconductor device 201 have the same function. As compared with semiconductor device 1, the semiconductor device 201 does not have the epitaxial silicon layer 20, the P type high concentration impurity layer 31, and the N type high concentration impurity layer 41, but has the P type impurity layer 231 and the N type impurity layer 241. Further, as compared with semiconductor device 1, the fourth region 203B of the active region 203 in the semiconductor device 201 does not have the depressed part 8 and the active region 204 in the semiconductor device 201 does not have the depressed part 9. The semiconductor device 1 is an example of "a first semiconductor device". The semiconductor device 201 is an example of "a second semiconductor device". The printed wiring board 81 mounted with the semiconductor device 1 and the semiconductor device 201 is an example of "a semiconductor device".

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions has been described in detail, it should be understood that the various changes, substitutions, and alterations could be made hereto without departing from the spirit and scope of the invention.

What is claimed is:
1. A semiconductor device comprising:
a substrate;
a first active region formed in the substrate and that includes a first region that has a first width, a second region that has a second width larger than the first width and extended in a first direction, and a boundary of the first region and the second region that has a step formed by a difference between the first width and the second width;
a second active region formed in the substrate and extended in parallel to the second region of the first active region;
an element isolation insulating film formed in the substrate and that partitions the first active region and the second active region, respectively;
a first gate electrode and a second gate electrode formed on the second region of the first active region; and
a third gate electrode and a fourth gate electrode formed on the second active region;
wherein each of the first active region and the second active region is a single continuous region, the second region of the first active region includes a depressed part depressed in a second direction that is perpendicular to the first direction in a plan view,
the first active region and the second active region are next to each other, the first gate electrode and the third gate electrode are connected to each other, the second gate electrode and the fourth gate electrode are connected to each other, the second region of the first active region includes the depressed part in a region except the boundary, extended in the first direction from the first gate electrode to the second gate electrode, and a width of the depressed part in the second region of the first active region is narrower than the second width.

2. The semiconductor device according to claim 1, further comprising:

a plurality of gate electrodes formed on the second region of the first active region and the second active region, wherein the plurality of gate electrodes include gate electrodes of a plurality of driver transistors and gate electrodes of a plurality of load transistors, and the second region of the first active region includes the depressed part between the gate electrodes of the plurality of driver transistors.

3. The semiconductor device according to claim 1, further comprising:

a ground contact is formed on the second region of the first active region; and a power source contact formed on the second active region.

4. The semiconductor device according to claim 1, further comprising:

an epitaxial layer formed on the substrate of the first active region and the second active region.

5. A semiconductor device, comprising:

a first semiconductor device that includes: a first substrate; a first active region that is formed in the first substrate and that includes a first region that has a first width, a second region that has a second width larger than the first width and extended in a first direction, and a boundary of the first region and the second region that has a step formed by a difference between the first width and the second width; a second active region formed in the first substrate and extended in parallel to the second region of the first active region; a first element isolation insulating film formed in the first substrate and that partitions the first active region and the second active region, respectively; a first gate electrode and a second gate electrode formed on the second region of the first active region; a third gate electrode and a fourth gate electrode formed on the second active region; and an epitaxial layer formed in the first active region and the second active region, and a second semiconductor device that includes: a second substrate; a third active region that is formed in the second substrate and that includes a third region that has a third width and a fourth region that has a fourth width larger than the third width and extended in a second direction; a fourth active region formed in the second substrate and extended in parallel to the third region of the third active region; and a second element isolation insulating film formed in the second substrate and that partitions the third active region and the fourth active region, respectively, wherein each of the first active region and the second active region is a single continuous region, the second region of the first active region includes a depressed part depressed in a second direction that is perpendicular to the first direction in a plan view, the first active region and the second active region are next to each other, the first gate electrode and the third gate electrode are connected to each other, the second gate electrode and the fourth gate electrode are connected to each other, the second region of the first active region includes the depressed part in a region except the boundary, extended in the first direction from the first gate electrode to the second gate electrode and a width of the depressed part in the second region of the first active region is narrower than the second width.

6. The semiconductor device according to claim 1, wherein a conductive type of the first active region is different from a conductive type of the second active region.

7. The semiconductor device according to claim 5, wherein a conductive type of the first active region is different from a conductive type of the second active region.

8. The semiconductor device according to claim 1, wherein the first gate electrode and the second gate electrode are arranged along the first direction, and the third gate electrode and the fourth gate electrode are arranged along the first direction.

9. The semiconductor device according to claim 5, wherein the first gate electrode and the second gate electrode are arranged along the first direction, and the third gate electrode and the fourth gate electrode are arranged along the first direction.

10. A semiconductor device comprising:

a substrate;

a first active region formed in the substrate and that includes two first regions that have a first width, a second region that has a second width larger than the first width and extended in a first direction, and a boundary of the first region and the second region that has a step formed by a difference between the first width and the second width;

a second active region formed in the substrate and extended in parallel to the second region of the first active region; and an element isolation insulating film formed in the substrate and that partitions the first active region and the second active region, respectively, wherein the second region of the first active region is located between the two first regions of the first active region, the second region of the first active region is contiguous to the two first regions of the first active region, the second region of the first active region includes a depressed part depressed in a second direction that is perpendicular to the first direction in a plan view, the second region of the first active region includes the depressed part in a region except the boundary, extended in the first direction, and a width of the depressed part in the second region of the first active region is narrower than the second width.

11. A semiconductor device, comprising:

a first semiconductor device that includes: a first substrate; a first active region that is formed in the first substrate and that includes two first regions that have a first width,. a second region that has a second width larger than the first width and extended in a first direction, and a boundary of the first region and the second region that has a step formed by a difference between the first width and the second width; a second active region formed in the first substrate and extended in parallel to the second region of the first active region; a first element isolation insulating film formed in the first substrate and that partitions the first active region and the second active region, respectively; and an epitaxial layer formed in the first active region and the second active region, and a second semiconductor device that includes: a second substrate; a third active region that is formed in the second substrate and that includes a third region that has a third width and a fourth region that has a fourth width larger than the third width and extended in a third direction;

a fourth active region formed in the second substrate and extended in parallel to the third region of the third active region; and a second element isolation insulating film formed in the second substrate and that partitions the third active region and the fourth active region, respectively, wherein the second region of the first active region is located between the two first regions of the first active region, the second region of the first active region is contiguous to the two first regions of the first active region, the second region of the first active region includes a depressed part depressed in a second direction that is perpendicular to the first direction in a plan view, the second region of the first active region includes the depressed part in a region except the boundary, extended in the first direction, and a width of the depressed part in the second region of the first active region is narrower than the second width.

12. The semiconductor device according to claim 10, further comprising:

a first gate electrode and a second gate electrode formed on the second region of the first active region; and a third gate electrode and a fourth gate electrode formed on the second active region;

wherein each of the first active region and the second active region is a single continuous region, the second region of the first active region or the second active region includes a depressed part depressed in a second direction that is perpendicular to the first direction in a plan view, the first active region and the second active region are next to each other, the first gate electrode and the third gate electrode are connected to each other, and the second gate electrode and the fourth gate electrode are connected to each other.

13. The semiconductor device according to claim 11, further comprising:

a first gate electrode and a second gate electrode formed on the second region of the first active region; and a third gate electrode and a fourth gate electrode formed on the second active region;

wherein each of the first active region and the second active region is a single continuous region, the second region of the first active region or the second active region includes a depressed part depressed in a second direction that is perpendicular to the first direction in a plan view, the first active region and the second active region are next to each other, the first gate electrode and the third gate electrode are connected to each other, and the second gate electrode and the fourth gate electrode are connected to each other.

* * * * *